(12) United States Patent
Jo et al.

(10) Patent No.: US 12,317,719 B2
(45) Date of Patent: May 27, 2025

(54) DISPLAY PANEL AND DISPLAY DEVICE AND MOBILE TERMINAL INCLUDING THE SAME

(71) Applicant: LG Display Co., Ltd., Seoul (KR)

(72) Inventors: Jung Geun Jo, Paju-si (KR); Seung Hyun Kim, Paju-si (KR); Hong Seop Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/074,313

(22) Filed: Dec. 2, 2022

(65) Prior Publication Data
US 2023/0363229 A1    Nov. 9, 2023

(30) Foreign Application Priority Data

May 3, 2022   (KR) .................. 10-2022-0054899
Jun. 29, 2022  (KR) .................. 10-2022-0079664

(51) Int. Cl.
*G09G 3/3233* (2016.01)
*H10K 59/35* (2023.01)
*H10K 59/12* (2023.01)

(52) U.S. Cl.
CPC ......... *H10K 59/353* (2023.02); *G09G 3/3233* (2013.01); *G09G 2300/0819* (2013.01);
(Continued)

(58) Field of Classification Search
CPC .... H10K 59/353; H10K 59/12; H10K 59/351; G09G 3/3233; G09G 2300/0819;
(Continued)

(56) References Cited

U.S. PATENT DOCUMENTS 11,217,211 B2    1/2022  Tang et al.
11,302,235 B2    4/2022  Lee et al.
(Continued)

FOREIGN PATENT DOCUMENTS

CN          112447805 A    3/2021
KR     10-2020-0079868 A    7/2020
(Continued)

OTHER PUBLICATIONS

Dictionary.com, "adjacent," in Dictionary.com Unabridged. Source location: Random House, Inc. http://dictionary.reference.com/browse/adjacent, Nov. 18, 2011, p. 1.*
(Continued)

*Primary Examiner* — Jeff Piziali
(74) *Attorney, Agent, or Firm* — Fenwick & West LLP

(57) ABSTRACT

The present disclosure relates to a display panel, and a display device and a mobile terminal including the same. The display panel includes a first pixel area, a second pixel area, and a boundary pixel area disposed between the first pixel area and the second pixel area. The boundary pixel area includes a plurality of first emission regions and a plurality of second emission regions. The maximum luminance of the first emission region decreases as the distance from the second pixel area increases, and the maximum luminance of the second emission region increases as the distance from the second pixel area increases.

11 Claims, 31 Drawing Sheets

(52) U.S. Cl.
CPC .............. *G09G 2300/0842* (2013.01); *G09G 2310/0297* (2013.01); *G09G 2310/08* (2013.01); *G09G 2320/0626* (2013.01); *G09G 2320/0673* (2013.01); *G09G 2320/0686* (2013.01); *G09G 2330/021* (2013.01); *H10K 59/12* (2023.02); *H10K 59/351* (2023.02)

(58) Field of Classification Search
CPC ... G09G 2300/0842; G09G 2310/0297; G09G 2310/08; G09G 2320/0626; G09G 2320/0673; G09G 2320/0686; G09G 2330/021
See application file for complete search history.

(56) References Cited

U.S. PATENT DOCUMENTS

| | | | |
|---|---|---|---|
| 11,399,135 | B2 | 7/2022 | Kim et al. |
| 11,462,156 | B2 | 10/2022 | Yang et al. |
| 2020/0213514 | A1 | 7/2020 | Kim et al. |
| 2020/0394964 | A1* | 12/2020 | Hyun .............. G09G 3/3208 |
| 2021/0027751 | A1 | 1/2021 | Tang et al. |
| 2021/0056913 | A1* | 2/2021 | Ko .................. G06F 1/1684 |
| 2021/0065620 | A1* | 3/2021 | Yang .............. G09G 3/3208 |
| 2021/0065625 | A1 | 3/2021 | Wang et al. |
| 2021/0183296 | A1 | 6/2021 | Lee et al. |
| 2021/0225265 | A1* | 7/2021 | Hong .............. G09G 3/3233 |
| 2021/0241680 | A1 | 8/2021 | Ock et al. |
| 2021/0287610 | A1 | 9/2021 | Kim et al. |
| 2022/0020777 | A1 | 1/2022 | Baek et al. |
| 2022/0037421 | A1 | 2/2022 | Park et al. |
| 2022/0115456 | A1 | 4/2022 | Oh et al. |
| 2022/0337748 | A1 | 10/2022 | Kim et al. |

FOREIGN PATENT DOCUMENTS

| | | |
|---|---|---|
| KR | 10-2021-0027628 A | 3/2021 |
| KR | 10-2021-0077092 A | 6/2021 |
| KR | 10-2021-0098091 A | 8/2021 |
| KR | 10-2021-0114593 A | 9/2021 |
| KR | 10-2022-0009533 A | 1/2022 |
| KR | 10-2022-0025303 A | 3/2022 |
| KR | 10-2022-0048220 A | 4/2022 |

OTHER PUBLICATIONS

Korean Intellectual Property Office, Notice for Granting Patent, KR Patent Application No. 10-2022-0079664, Sep. 20, 2022, five pages.
Korean Intellectual Property Office, Preliminary Examination Result Notice, KR Patent Application No. 10-2022-0079664, Jul. 18, 2022, 20 pages.
China National Intellectual Property Administration, Office Action, Chinese Patent Application No. 202211563188.1, Jul. 11, 2024, 15 pages.
German Patent and Trade Mark Office, Office Action, German Patent Application No. 10 2022 134 935.7, Jul. 11, 2024, 13 pages.

* cited by examiner

R: R SUB-PIXEL
G: G SUB-PIXEL
B: B SUB-PIXEL

DISPLAY PANEL AND DISPLAY DEVICE AND MOBILE TERMINAL INCLUDING THE SAME

CROSS-REFERENCE TO RELATED APPLICATIONS

This application claims priority to and the benefit of Republic of Korea Patent Application No. 10-2022-0054899, filed in the Republic of Korea on May 3, 2022, and Republic of Korea Patent Application No. 10-2022-0079664, filed in the Republic of Korea on Jun. 29, 2022, each of which are hereby incorporated by reference in its entirety.

BACKGROUND

1. Field

The present disclosure relates to a display panel having an optical element disposed thereunder, a display device and a mobile terminal including the same.

2. Discussion of Related Art

Electroluminescent display devices are generally classified into inorganic light emitting display devices and organic light emitting display devices according to the materials of light emitting layers. Active matrix type organic light emitting display devices include organic light-emitting diodes (hereinafter referred to as "OLEDs"), which emit light by themselves, and have fast response speeds and advantages in which light emission efficiencies, brightness, and viewing angles are high. In the organic light-emitting display devices, the OLEDs are formed in pixels. Since the organic light-emitting display devices have fast response speeds and are excellent in light emission efficiency, brightness, and viewing angle as well as being able to exhibit a black gradation in a full black color, the organic light-emitting display devices are excellent in a contrast ratio and color reproducibility.

Recently, various optical elements have been added to mobile terminals. The optical elements may include a sensor or lighting device necessary to support a multimedia function or perform biometric recognition. The optical element may be assembled under the display panel. In order to enlarge the screen of the mobile terminal, the optical element may be disposed in a notch area designed in a concave shape on the top of the screen of the display panel or in a punch hole within the screen. However, since an image is not displayed in the notch area or the punch hole, there are many limitations in the design of a full-screen display.

SUMMARY

Recently, a technique of providing an area with low pixel density in a display panel and disposing an optical element under the area has been proposed. This technique may realize a full-screen display since the optical element is placed under an area where the image is displayed, but the boundary between an area with high pixel density and an area with low pixel density may be visually recognized, and a sense of heterogeneity may be felt in luminance and color between the areas.

An object of the present disclosure is to solve the above-mentioned necessity and/or problems.

The present disclosure provides a display panel capable of preventing boundary recognition and a sense of heterogeneity between areas with different pixel densities, and a display device and a mobile terminal including the same.

The problems of the present disclosure are not limited to those mentioned above, and other problems not mentioned will be clearly understood by those skilled in the art from the following description.

A display panel according to an embodiment of the present disclosure includes a first pixel area, a second pixel area, and a boundary pixel area disposed between the first pixel area and the second pixel area. The boundary pixel area includes a plurality of first emission regions and a plurality of second emission regions. Each of the first and second emission regions includes one or more pixels. At least one of the second emission regions is disposed between the first emission regions adjacent to each other. Maximum luminance of the first emission region decreases as a distance from the second pixel area increases, and maximum luminance of the second emission region increases as a distance from the second pixel area increases.

A display device according to an embodiment of the present disclosure includes: a display panel including a first pixel area, a second pixel area, and a boundary pixel area disposed between the first pixel area and the second pixel area; and a display panel driver configured to write pixel data of an input image into pixels disposed in pixel areas of the display panel. The second pixel area includes a plurality of unit emission regions. The boundary pixel area includes a plurality of unit emission regions. Each of the unit emission regions of the second pixel area includes an emission region and a non-emission region. Each of the unit emission regions of the boundary pixel area has the same size as the unit emission region of the second pixel area. Each of the unit emission regions of the boundary pixel area includes a first emission region and a second emission region. The first emission regions are spaced apart from each other by a distance equal to a distance between the emission regions of the second pixel area, with the second emission region interposed therebetween. Maximum luminance of the first emission region decreases as a distance from the second pixel area increases, and maximum luminance of the second emission region increases as a distance from the second pixel area increases.

A mobile terminal according to an embodiment of the present disclosure includes: a display panel including a first pixel area, a second pixel area, and a boundary pixel area disposed between the first pixel area and the second pixel area; a display panel driver configured to write pixel data of an input image into pixels disposed in pixel areas of the display panel; and an optical element disposed under the second pixel area of the display panel. The second pixel area includes a plurality of unit emission regions. The boundary pixel area includes a plurality of unit emission regions. Each of the unit emission regions of the second pixel area includes an emission region and a non-emission region. Each of the unit emission regions of the boundary pixel area has the same size as the unit emission region of the second pixel area. Each of the unit emission regions of the boundary pixel area includes a first emission region and a second emission region. The first emission regions are spaced apart from each other by a distance equal to a distance between the emission regions of the second pixel area, with the second emission region interposed therebetween. Maximum luminance of the first emission region decreases as a distance from the second pixel area increases, and maximum luminance of the second emission region increases as a distance from the second pixel area increases.

According to the present disclosure, a full-screen display may be realized since an optical module is disposed under the screen on which an image is displayed.

According to the present disclosure, a sense of heterogeneity for the boundary pixel area may be reduced by controlling an emission spatial period of the boundary pixel area and the second pixel area to be substantially the same.

According to the present disclosure, a sense of heterogeneity for the pixel area may be reduced by controlling the luminance of the pixels so that the luminance of the first emission region of the boundary pixel area gradually changes between the first pixel area and the second pixel area.

According to the present disclosure, a color difference between the pixel areas may be improved by controlling the luminance of the first and second emission regions by using first and second gamma compensation curves having different maximum luminances in the boundary pixel area.

The effects of the present disclosure are not limited to those mentioned above, and other effects not mentioned will be clearly understood by those skilled in the art from the description.

BRIEF DESCRIPTION OF THE DRAWINGS

The above and other objects, features, and advantages of the present disclosure will become more apparent to those of ordinary skill in the art by describing exemplary embodiments thereof in detail with reference to the attached drawings, in which.

DETAILED DESCRIPTION

Figure 1:
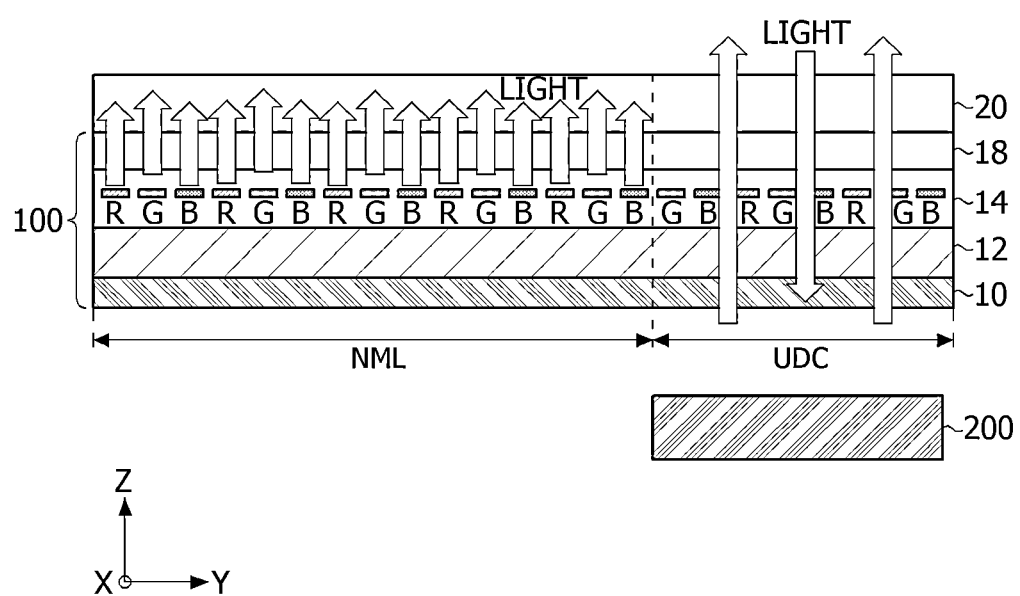
FIG. 1 is a cross-sectional view schematically showing a display panel according to an embodiment of the present disclosure.

The advantages and features of the present disclosure and methods for accomplishing the same will be more clearly understood from embodiments described below with reference to the accompanying drawings. However, the present disclosure is not limited to the following embodiments but can be implemented in various different forms. Rather, the present embodiments will make the disclosure of the present disclosure complete and allow those skilled in the art to completely comprehend the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies can be omitted to avoid unnecessarily obscuring the subject matter of the present disclosure.

The terms such as "comprising," "including," "having," and "comprising" used herein are generally intended to allow other components to be added unless the terms are used with the term "only." Any references to singular can include plural unless expressly stated otherwise.

Components are interpreted to include an ordinary error range even if not expressly stated.

When the position relation between two components is described using the terms such as "on," "above," "below," "next,", "connect", "couple", "crossing", "intersecting" etc. one or more components can be positioned between the two components unless the terms are used with the term "immediately" or "directly."

The terms "first," "second," and the like can be used to distinguish components from each other, but the functions or structures of the components are not limited by ordinal numbers or component names in front of the components. These terms may not define any order.

The same reference numerals can refer to substantially the same elements throughout the present disclosure.

The following embodiments can be partially or entirely bonded to or combined with each other and can be linked and operated in technically various ways. The embodiments can be carried out independently of or in association with each other.

In each display device of the present disclosure, the pixel circuit and the gate driving circuit can include a plurality of transistors. Transistors can be implemented as oxide thin film transistors (oxide TFTs) including an oxide semiconductor, low temperature polysilicon (LTPS) TFTs including low temperature polysilicon, or the like. Each of the transistors can be implemented as a p-channel TFT or an n-channel TFT.

A transistor is a three-electrode element including a gate, a source, and a drain. The source is an electrode that supplies carriers to the transistor. In the transistor, carriers start to flow from the source. The drain is an electrode through which carriers exit from the transistor. In a transistor, carriers can flow from a source to a drain. In the case of an n-channel transistor, since carriers are electrons, a source voltage is a voltage lower than a drain voltage such that electrons can flow from a source to a drain. The n-channel transistor has a direction of a current flowing from the drain to the source. In the case of a p-channel transistor, since carriers are holes, a source voltage is higher than a drain voltage such that holes can flow from a source to a drain. In the p-channel transistor, since holes flow from the source to the drain, a current flows from the source to the drain. It should be noted that a source and a drain of a transistor are not fixed. For example, a source and a drain can be changed according to an applied voltage. Therefore, the disclosure is not limited due to a source and a drain of a transistor. In the following description, a source and a drain of a transistor will be referred to as a first electrode and a second electrode.

A gate signal swings between a gate-on voltage and a gate-off voltage. The gate-on voltage is set to a voltage higher than a threshold voltage of a transistor, and the gate-off voltage is set to a voltage lower than the threshold voltage of the transistor. The transistor is turned on in response to the gate-on voltage and is turned off in response to the gate-off voltage. In the case of the n-channel transistor, a gate-on voltage can be a gate high voltage VGH and VEH, and a gate-off voltage can be a gate low voltage VGL and VEL. In the case of the p-channel transistor, a gate-on voltage can be a gate low voltage VGL and VEL, and a gate-off voltage can be a gate high voltage VGH and VEH.

Hereinafter, various embodiments of the present disclosure will be described in detail with reference to the accompanying drawings.

Figure 2:
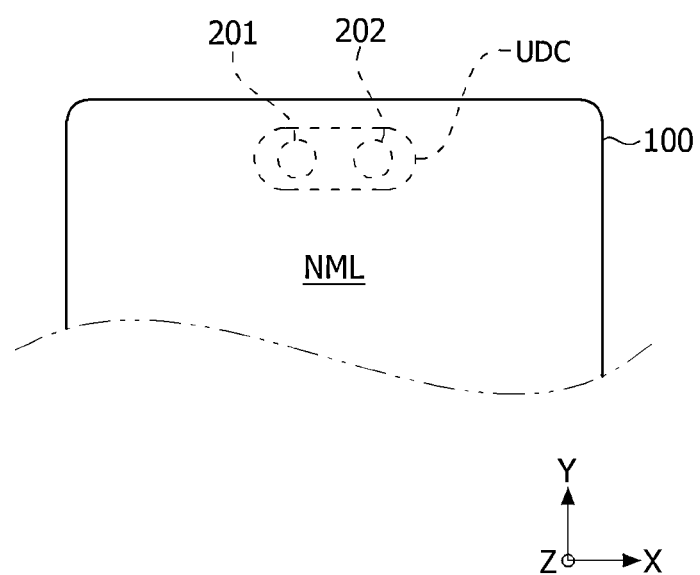
FIG. 2 is a diagram illustrating an optical element overlapping a second pixel area of a display panel according to an embodiment of the present disclosure.
Figure 3:
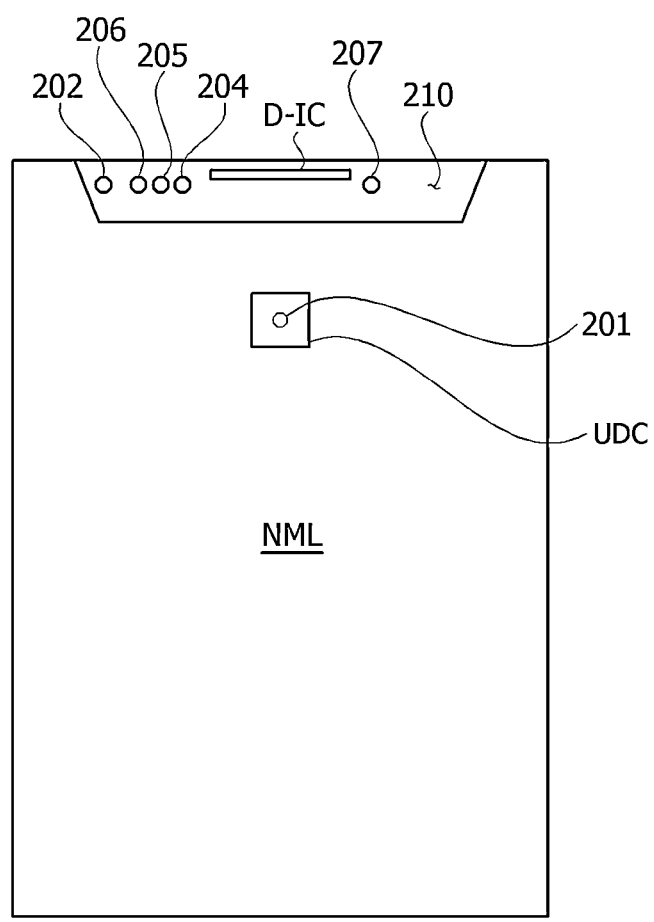
FIG. 3 is a diagram illustrating an example of optical elements disposed in a second pixel area and a notch area according to an embodiment of the present disclosure.

Referring to FIGS. 1 to 3, the display panel 100 includes a screen for reproducing an input image according to an embodiment of the present disclosure.

A pixel array constituting the screen of the display panel 100 may include a first pixel area NML and a second pixel area UDC. The first pixel area NML and the second pixel area UDC include pixels to which pixel data of the input image is written. Accordingly, the input image may be displayed in the first pixel area NML and the second pixel area UDC.

The first pixel area NML is a display area in which a plurality of pixels are disposed to reproduce the input image. The first pixel area NML is larger than the second pixel area UDC and is a main display area of the screen on which most images are displayed. The second pixel area UDC is a display area in which a plurality of pixels are disposed to reproduce the input image. The pixel density or resolution of the second pixel area UDC may be the same as or less than that of the first pixel area NML. The pixel density may be interpreted as pixels per inch (PPI).

The second pixel area UDC may include a plurality of light transmitting portions having no light-blocking medium, but is not limited thereto. The light transmitting portion may be disposed between sub-pixels. Light may pass through the light transmitting portion with little loss. When the light transmitting portion of the second pixel area UDC is enlarged in order to increase the amount of light received by the optical element on which light is incident through the second pixel area UDC, the pixel density is reduced due to the area of the light transmitting portion, so that the pixel density or resolution of the second pixel area UDC may become smaller than that of the first pixel area NML.

Each of the pixels of the first pixel area NML and the second pixel area UDC includes sub-pixels having different colors to implement an image color. The sub-pixels include red, green, and blue sub-pixels. Hereinafter, the red sub-pixel is abbreviated as "R sub-pixel", the green sub-pixel is abbreviated as "G sub-pixel", and the blue sub-pixel is abbreviated as "B sub-pixel". Each of the pixels may further include a white sub-pixel. Each of the sub-pixels may include a pixel circuit for driving a light emitting element.

One or more optical elements 200 may be disposed under the rear surface of the display panel 100 to overlap the second pixel area UDC of the display panel 100. External light may travel to the optical element 200 disposed under the display panel 100 through the second pixel area UDC. The optical element 200 may include at least one of an image sensor (or camera), a proximity sensor, a white light illuminator, and an optical element for face recognition.

The optical element for face recognition may include an infrared light source, an infrared camera, an infrared illuminator, and the like disposed under the second pixel area UDC of the display panel 100. In FIG. 2, reference numeral "201" denotes the infrared light source, and reference numeral "202" denotes the infrared camera, but they are not limited thereto. In an example of FIG. 3, an ambient light sensor 204, a proximity sensor 205, a flood illuminator 206, and the infrared camera 202, and a front camera 207 may be disposed in a notch area 210 of a mobile terminal, and the infrared light source 201 may be disposed in the second pixel area UDC. The notch area 210 is a non-display area having no pixels at the top of the screen of the mobile terminal.

In the display device of the present disclosure, since the optical elements 200 are disposed under the rear surface of the display panel 100 to overlap the second pixel area UDC, the display area of the screen is not restricted by the optical elements 200. Accordingly, the display device of the present disclosure may realize a full-screen display by enlarging the display area of the screen and increase the degree of freedom in screen design.

The display panel 100 has a width in a first direction (X-axis), a length in a second direction (Y-axis), and a thickness in a third direction (Z-axis). The first direction and the second direction are orthogonal to each other on the plane of the display panel 100. The display panel 100 may include a circuit layer 12 disposed on a substrate, and a light emitting element layer 14 disposed on the circuit layer 12. A polarizing plate 18 may be disposed on the light emitting element layer 14, and a cover glass 20 may be disposed on the polarizing plate 18.

The circuit layer 12 may include a pixel circuit connected to wires such as data lines, gate lines intersecting the data lines, and power lines, a gate driver connected to the gate lines, and the like. The circuit layer 12 may include transistors implemented as thin film transistors (TFTs) and circuit elements such as capacitors. The wiring and circuit elements of the circuit layer 12 may be formed of a plurality of insulating layers, two or more metal layers separated with an insulating layer therebetween, and an active layer including a semiconductor material.

The light emitting element layer 14 may include a light emitting element driven by the pixel circuit. The light emitting element may be implemented with an OLED. The OLED includes an organic compound layer formed between an anode and a cathode. The organic compound layer may include a hole injection layer (HIL), a hole transport layer (HTL), an emission layer (EML), an electron transport layer (ETL), and an electron injection layer (EIL), but is not limited thereto. When a voltage is applied to the anode and cathode electrodes of the OLED, holes passing through the hole transport layer (HTL) and electrons passing through the electron transport layer (ETL) are moved to the emission layer (EML) to form excitons, and visible light is emitted from the emission layer (EML). The light emitting element layer 14 may further include a color filter array disposed on the light emitting element to selectively transmit red, green, and blue wavelengths.

The light emitting element layer 14 may be covered by a passivation layer, and the passivation layer may be covered by an encapsulation layer. The passivation layer and the encapsulation layer may have a multi-insulating film structure in which an organic film and an inorganic film are alternately stacked. The inorganic film blocks the permeation of moisture or oxygen. The organic film planarizes the surface of the inorganic film. When the organic film and the inorganic film are stacked in multiple layers, the movement path of moisture or oxygen becomes longer than that of a single layer, so that the permeation of moisture/oxygen affecting the light emitting element layer 14 may be effectively blocked.

A touch sensor layer omitted from the drawing may be formed on the encapsulation layer, and the polarizing plate 18 or a color filter layer may be disposed thereon. The touch sensor layer may include capacitive touch sensors that sense a touch input based on a change in capacitance before and after the touch input. The touch sensor layer may include insulating films and metal wiring patterns that form the capacitance of the touch sensors. The insulating films may insulate intersecting portions in the metal wiring patterns and may planarize the surface of the touch sensor layer. The polarizing plate 18 may improve visibility and contrast ratio by converting the polarization of external light reflected by the metal of the touch sensor layer and the circuit layer. The polarizing plate 18 may be implemented as a circular polarizing plate or a polarizing plate in which a linear polarizing plate and a phase retardation film are bonded. The cover glass 20 may be bonded to the polarizing plate 18. The color filter layer disposed on the touch sensor layer may include red, green, and blue color filters. The color filter layer may further include a black matrix pattern. The color filter layer may absorb a part of the wavelength of light reflected from the circuit layer and the touch sensor layer to replace the role of the polarizing plate 18 and increase the color purity of an image reproduced in the pixel array. In this case, the polarizing plate 18 is not required.

Figure 4:
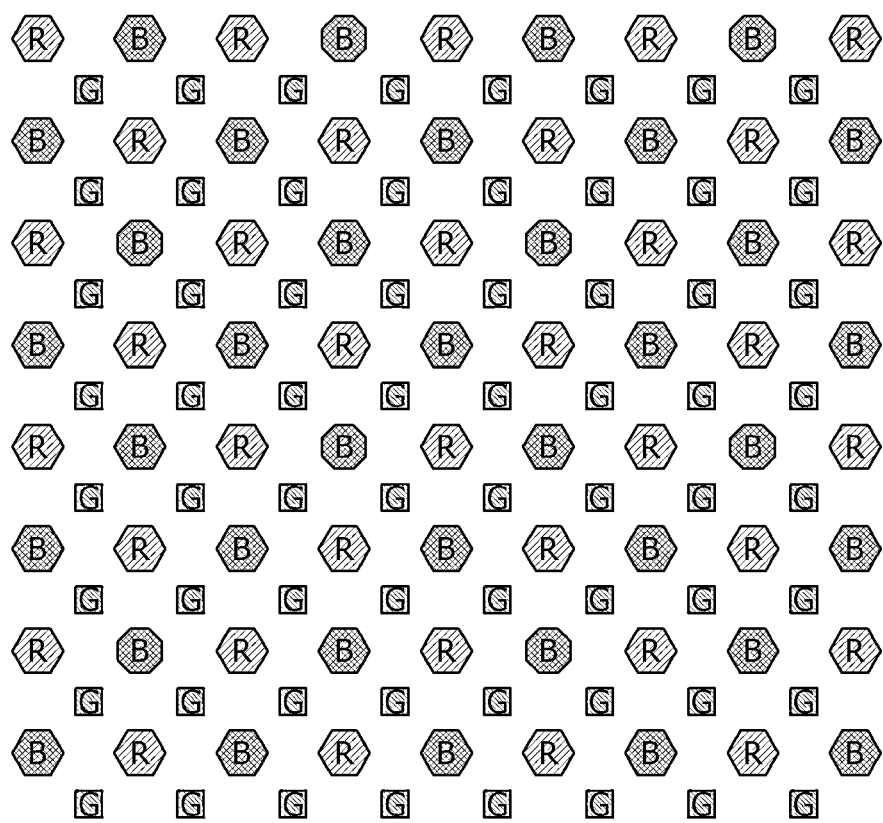
FIG. 4 is a diagram illustrating a pixel arrangement of a first pixel area according to an embodiment of the present disclosure.
Figure 5A:
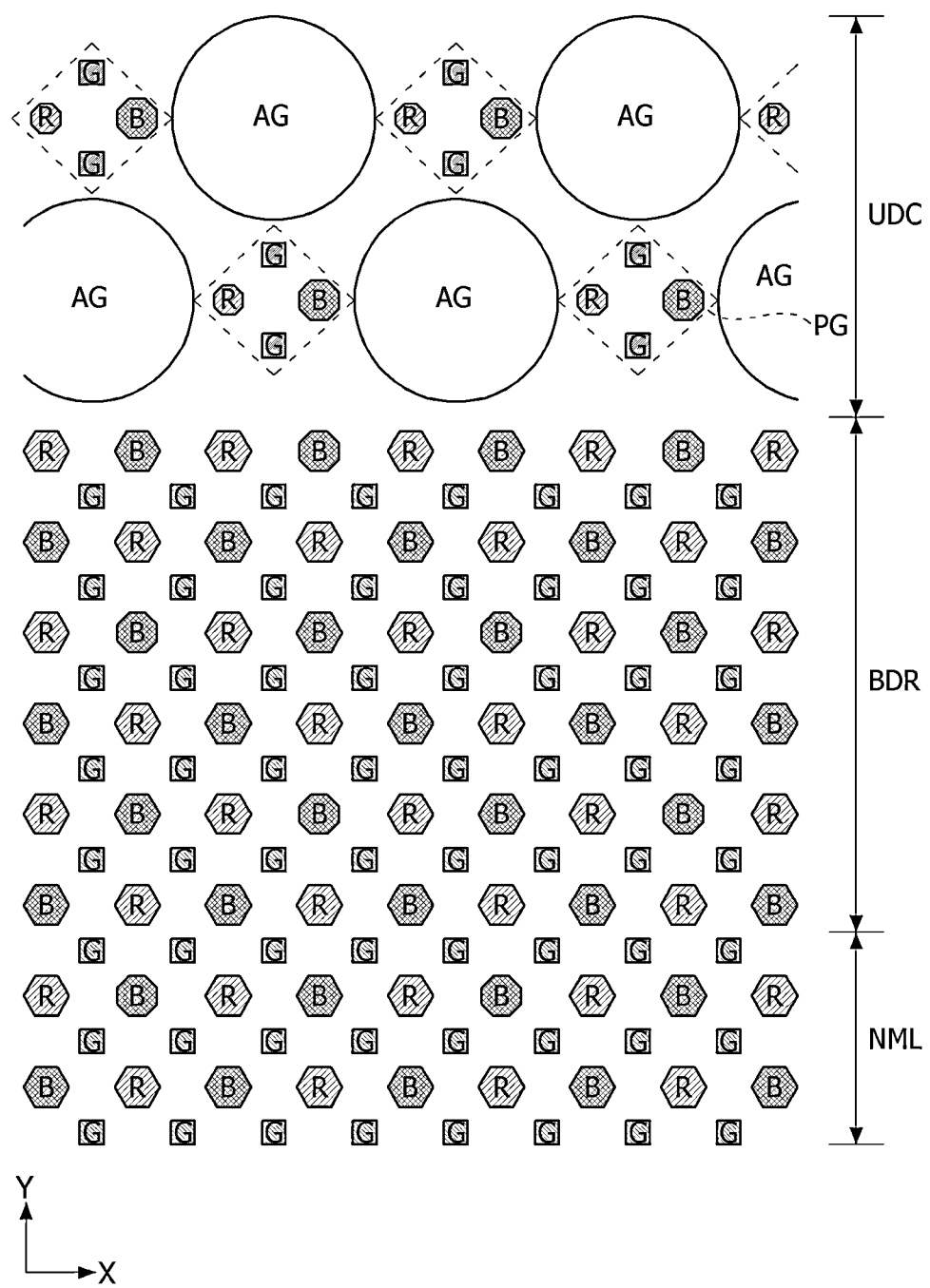
FIGS. 5A and 5B are diagrams illustrating a boundary pixel area and a pixel arrangement of a second pixel area according to an embodiment of the present disclosure.
Figure 5B:
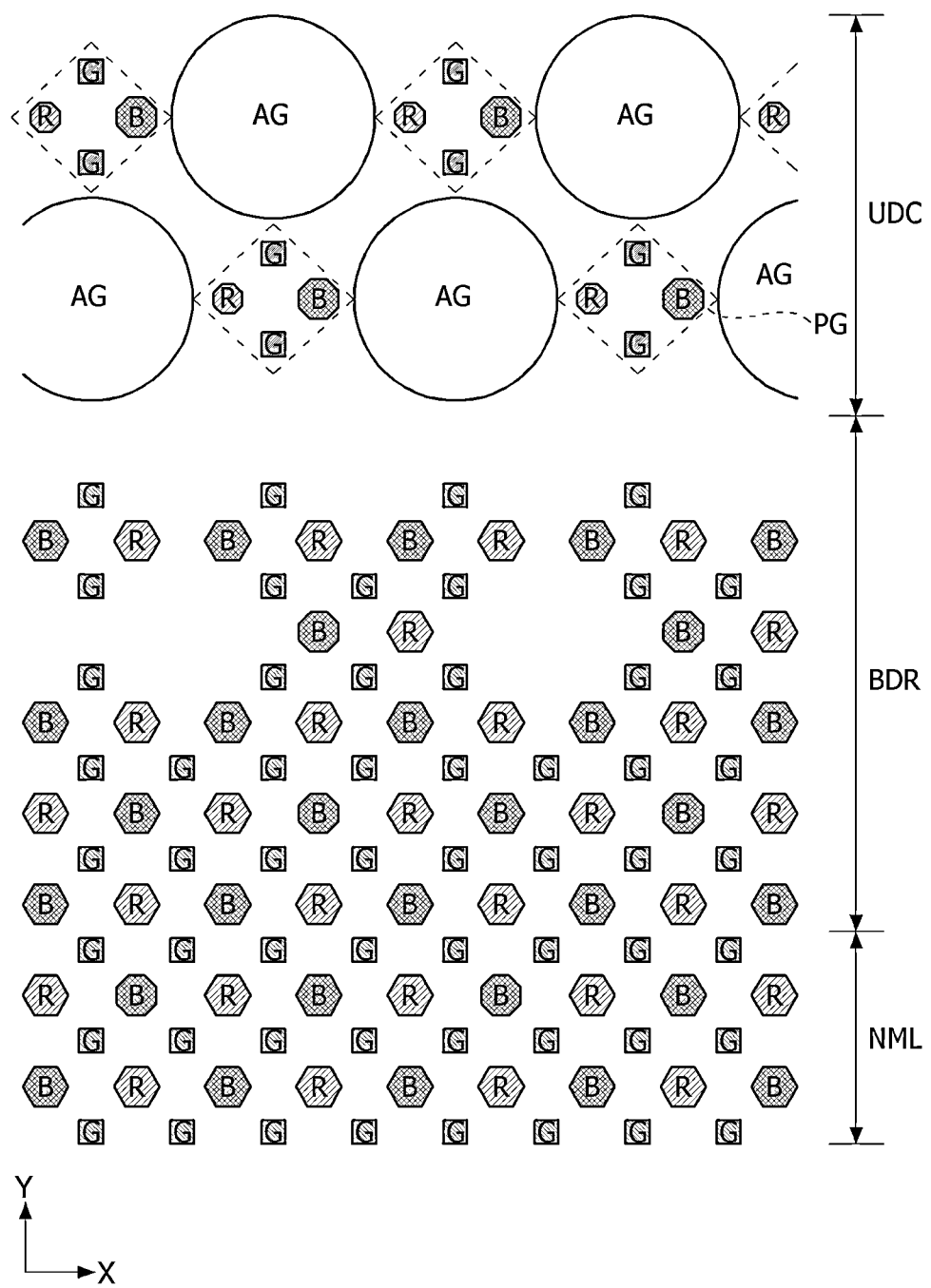

FIG. 4 is a diagram illustrating an example of pixel arrangement of the first pixel area NML according to an embodiment of the present disclosure. FIGS. 5A and 5B are diagrams illustrating an example of pixels and light transmitting portions of the second pixel area UDC according to an embodiment of the present disclosure. Wires connected to the pixels are omitted in FIGS. 4 to 5B.

Referring to FIG. 4, the first pixel area NML includes a plurality of pixels. Each of the pixels may be implemented as a real-type pixel in which R, G, and B sub-pixels of three primary colors are configured as one pixel. Each of the pixels may further include a W sub-pixel omitted from the drawing. The pixel density of the first pixel area NML may be higher than that of the second pixel area UDC.

Each of the pixels may be composed of two sub-pixels using a sub-pixel rendering algorithm. For example, a first pixel may be composed of an R sub-pixel and a first G sub-pixel, and a second pixel may be composed of a B sub-pixel and a second G sub-pixel. Insufficient color representation in each of the first and second pixels may be compensated for with an average value of corresponding color data between adjacent pixels.

In the sub-pixels, the light emission efficiency of the light emitting element may be different for each color. In consideration of this, the size of the sub-pixels may be different for each color. For example, among R, G, and B sub-pixels, the B sub-pixel may be the largest and the G sub-pixel may be the smallest.

Referring to FIGS. 5A and 5B, the second pixel area UDC includes pixel groups PG spaced apart by a predetermined distance, and light transmitting portions AG disposed between adjacent pixel groups PG. The pixel group disposed within a region indicated by a dotted line includes a plurality of sub-pixels.

The light transmitting portion AG is an area having no pixels. The light transmitting portions AG may be made of transparent insulating materials without including metal wires or pixels. Due to the light transmitting portions AG, the pixel density of the second pixel area UDC may be reduced, but the average light transmittance of the second pixel area UDC may become greater than that of the first pixel area NML, so that the amount of light received by the optical elements 200 may be increased.

In the second pixel area UDC, one or two pixels may be included in the pixel group PG to emit light with a luminance corresponding to a grayscale of pixel data. Each of the pixels of the pixel group PG may include two to four sub-pixels. In the example of FIGS. 5A and 5B, a first pixel is composed of R and G sub-pixels, and a second pixel is composed of B and G sub-pixels, but the present disclosure is not limited thereto. An emission region in the pixel group PG is determined as the sum of emission regions connected to the sub-pixels in the pixel group PG.

The shape and size of an emission region of each color in each of the pixels of the first and second pixel areas is determined by a fine metal mask (FMM). The emission region for each color in the pixel group PG of the second pixel area UDC may be designed to be substantially the same as that of the first pixel area NML, or may be designed to have a shape and/or size different from that of the emission region of the first pixel area NML by using an FMM having a shape different from that of the first pixel area NML.

The shape of the light transmitting portions AG is illustrated as a circle in FIGS. 5A and 5B, but is not limited thereto. For example, the light transmitting portions AG may be designed in various shapes, such as a circular shape, an elliptical shape, and a polygonal shape.

Due to process deviations and element characteristic deviations caused in the manufacturing process of the display panel, there may be a difference in electrical characteristics of driving elements between pixels, and such a difference may increase as the driving time of the pixels elapses. In order to compensate for deviations in the electrical characteristics of driving elements between pixels, an internal compensation technique or an external compensation technique may be applied to an organic light emitting display device.

As shown in FIGS. 5A and 5B, the pixel array of the display panel 100 further includes a boundary pixel area BDR having a predetermined size disposed between the first pixel area NML and the second pixel area UDC.

The boundary pixel area BDR is a pixel area of a predetermined size between the first pixel area NML and the second pixel area UDC. The boundary pixel area BDR includes a plurality of pixels. The pixel density of the boundary pixel area BDR may be designed, as shown in FIG. 5A, to be substantially the same as that of the first pixel area NML and higher than that of the second pixel area UDC. The pixel density of the boundary pixel area BDR may be less than that of the first pixel area NML. In another embodiment, as shown in FIG. 5B, the pixel density of a part of the boundary pixel area BDR adjacent to the second pixel area UDC may be less than that of the first pixel area NML, and may be equal to or higher than that of the second pixel area UDC.

Figure 12A:
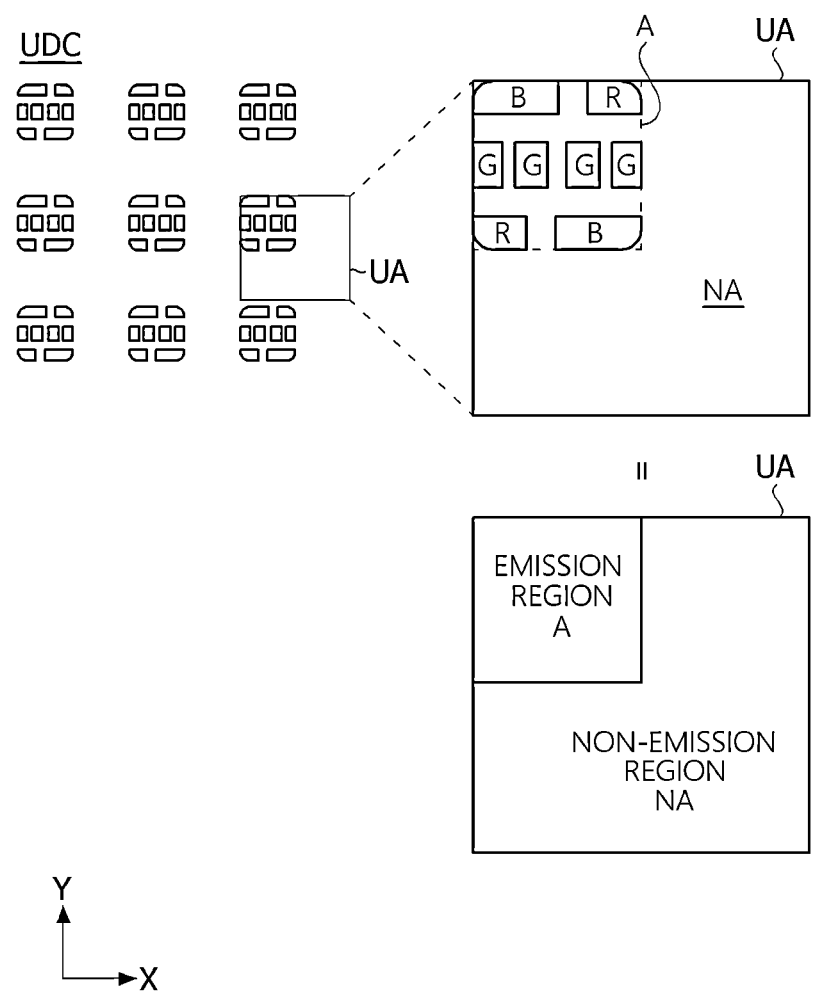
FIGS. 12A and 12B are plan views illustrating unit emission regions of a second pixel area and a boundary pixel area according to an embodiment of the present disclosure.
Figure 12B:
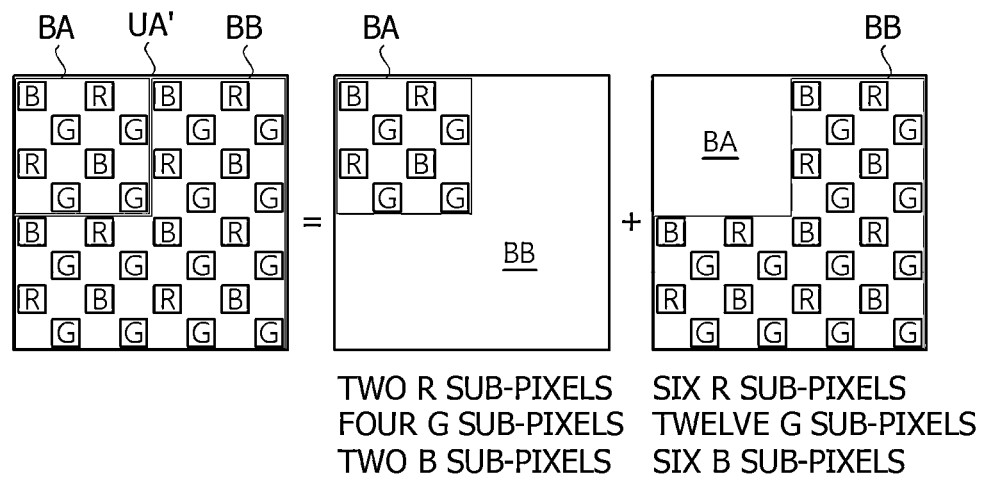
Figure 12B:
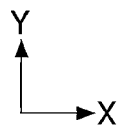

At least one of the pixel density, the pixel size, and the pixel maximum luminance may be different between the first pixel area NML and the second pixel area UDC. Accordingly, the boundary pixel area BDR may be viewed differently from the first pixel area NML and the second pixel area UDC. In order to reduce the phenomenon in which the boundary pixel area BDR is visually recognized, in the present disclosure, as shown in FIGS. 12A and 12B, a unit emission region UA' having the same size as a unit emission region UA of the second pixel area UDC is defined in the boundary pixel area BDR. A first emission region BA in each of unit emission regions UA' of the boundary pixel area BDR has a spatial period (or distance) similar to or equal to that of an emission region A of the second pixel area UDC.

The pixel density of the boundary pixel area BDR may be designed to be the same as that of the first pixel area NML. The boundary pixel area BDR may be interpreted as a partial pixel area included in the first pixel area NML close to the second pixel area UDC.

The internal compensation technology senses a threshold voltage of the driving element for each sub-pixel using an internal compensation circuit implemented in each pixel circuit, and compensates a gate-source voltage Vgs of the driving element by the threshold voltage. The external compensation technology senses a current or voltage of the driving element that changes according to the electrical characteristics of the driving element in real time using an external compensation circuit. The external compensation technology compensates for the deviation (or change) of the electric characteristic of the driving element in each pixel in real time by modulating the pixel data (digital data) of the input image by the electric characteristic deviation (or change) of the driving element sensed for each pixel.

Figure 6:
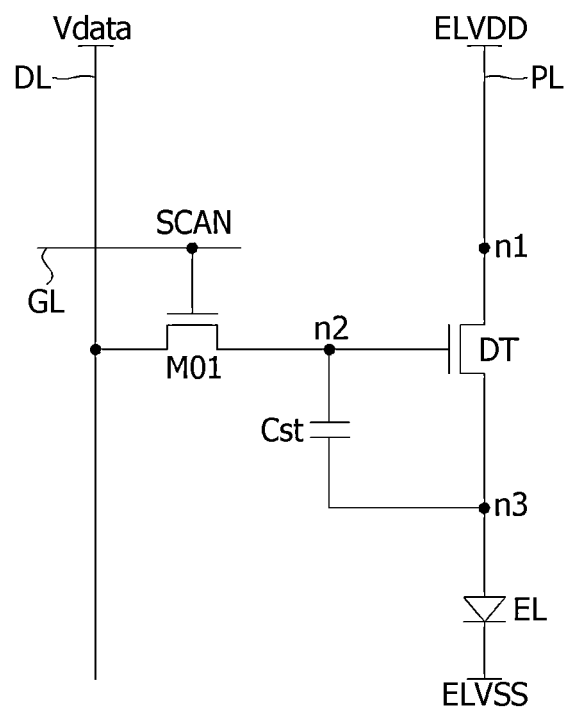
FIGS. 6 to 8 are circuit diagrams illustrating various pixel circuits applicable to a display device according to an embodiment of the present disclosure.
Figure 7:
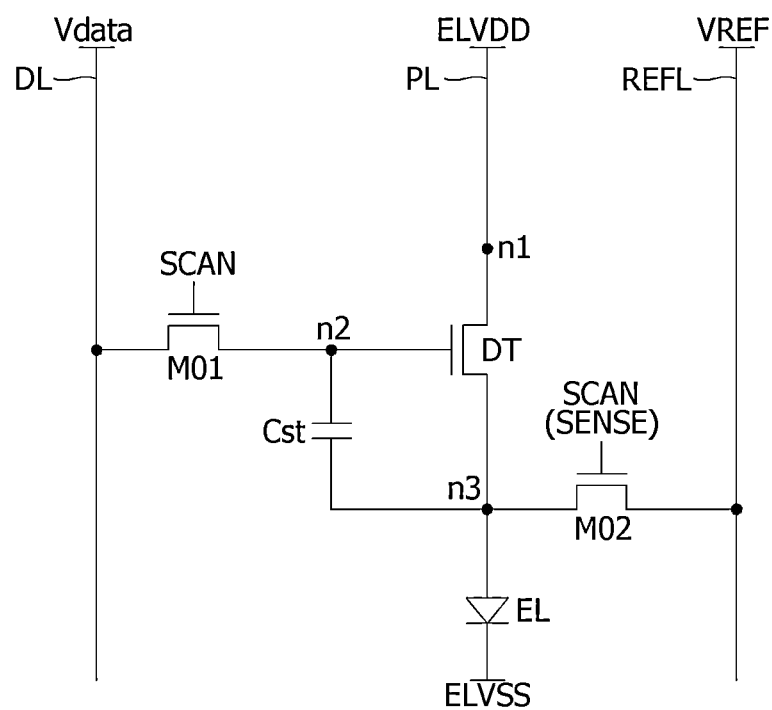
Figure 8:
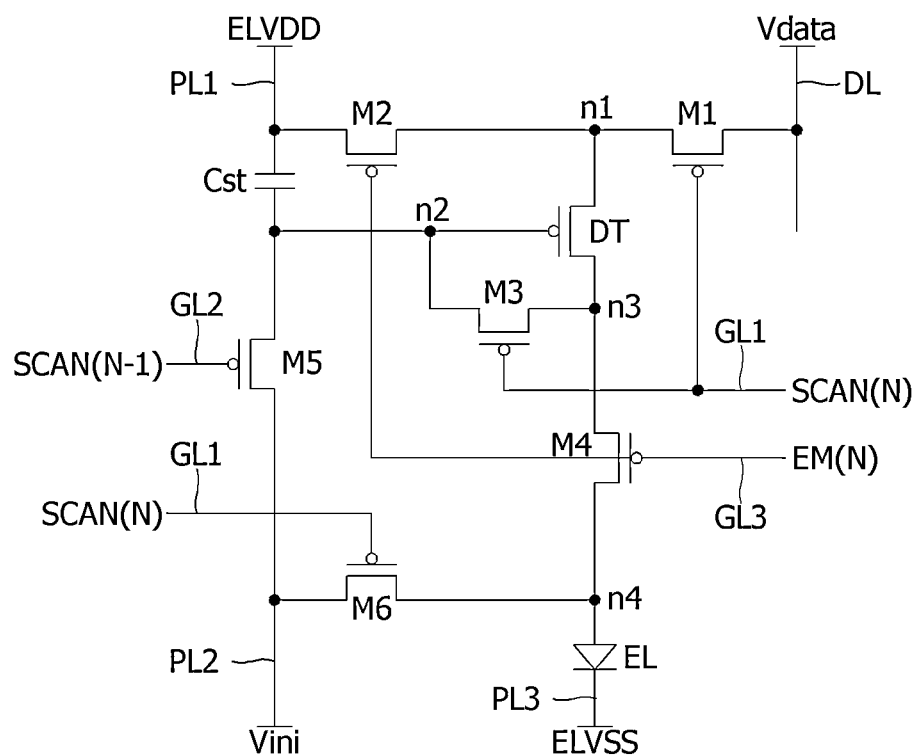

FIGS. 6 to 8 are circuit diagrams illustrating various pixel circuits applicable to any display device according to an embodiment of the present disclosure.

In a first example, referring to FIG. 6, the pixel circuit includes a light emitting element EL, a driving element DT configured to supply a current to the light emitting element EL, a switch element M01 configured to connect a data line DL to a second node n2 in response to a scan pulse SCAN, and a capacitor Cst connected between the second node n2 and a third node n3. The driving element DT and the switch element M01 can be implemented as n-channel transistors.

The driving element DT includes a gate electrode connected to the second node n2, a first electrode connected to a first node n1, and a second electrode connected to the third node n3. A VDD (power) line PL to which a pixel driving voltage ELVDD is applied is connected to the first node n1. The light emitting element EL includes an anode connected to the third node n3 and a cathode connected to a VSS line to which a low potential power voltage ELVSS is applied.

The driving element DT drives the light emitting element EL by supplying a current to the light emitting element EL according to the gate-source voltage Vgs. The light emitting element EL is turned on and emits light when a forward voltage between the anode and the cathode is equal to or greater than a threshold voltage. The capacitor Cst is connected between the gate electrode and a source electrode of the driving element DT to maintain the gate-source voltage Vgs of the driving element DT.

FIG. 7 shows a second example of the pixel circuit according to one embodiment.

Referring to FIG. 7, in addition to the configuration of the pixel circuit shown in FIG. 6, the pixel circuit further includes a second switch element M02 connected between a reference voltage line REFL and a second electrode of the driving element DT. In this pixel circuit, the driving element DT and the switch elements M01 and M02 can be implemented as n-channel transistors.

The second switch element M02 applies a reference voltage VREF to the third node n3 in response to the scan pulse SCAN or a separate sensing pulse SENSE. The reference voltage VREF is applied to the pixel circuit through the REF line REFL.

In a sensing mode, a current flowing through the channel of the driving element DT or a voltage between the driving element DT and the light emitting element EL can be sensed through the reference line REFL. The current flowing through the reference line REFL is converted into a voltage through an integrator and converted into digital data through an analog-to-digital converter (hereinafter referred to as an "ADC"). This digital data is sensing data including threshold voltage or mobility information of the driving element DT. The sensing data is transmitted to a data operation part. The data operation part can receive the sensing data from the ADC and compensate for driving deviation and deterioration of pixels by adding a compensation value selected based on the sensing data to the pixel data or multiplying the compensation value selected based on the sensing data by the pixel data.

Figure 9:
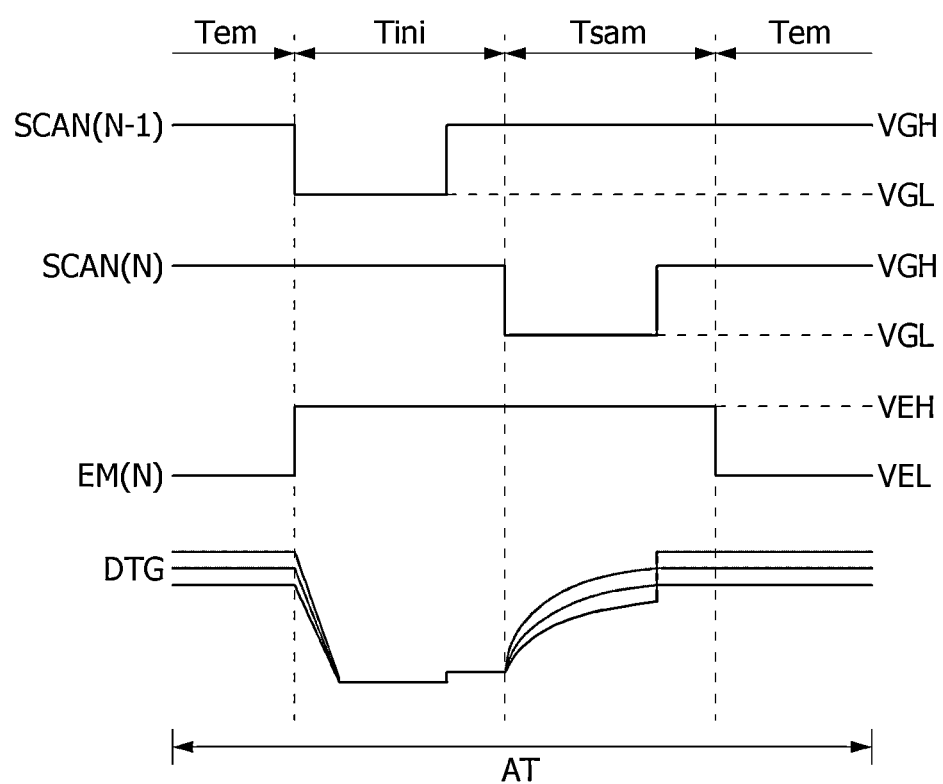
FIG. 9 is a waveform diagram illustrating a method of driving the pixel circuit shown in FIG. 8 according to an embodiment of the present disclosure.

FIG. 8 is a circuit diagram illustrating a third example of the pixel circuit according to an embodiment of the present disclosure. FIG. 9 is a waveform diagram illustrating a method of driving the pixel circuit shown in FIG. 8 according to an embodiment of the present disclosure.

Referring to FIGS. 8 and 9, the pixel circuit includes a light emitting element EL, a driving element DT configured to supply a current to the light emitting element EL, and a switch circuit configured to switch a voltage applied to the light emitting element EL and the driving element DT.

The switch circuit is connected to power lines PL1, PL2, and PL3 to which a pixel driving voltage ELVDD, a low potential power voltage ELVSS, and an initialization voltage Vini are applied, a data line DL, and gate lines GL1, GL2 and GL3, and switches voltages applied to the light emitting element EL and the driving element DT in response to a gate signal. The gate signal can include scan pulses SCAN(N-1) and SCAN(N) and an emission control pulse (hereinafter, referred to as an "EM pulse") EM(N). Here, N is a number, e.g., a positive integer.

The switch circuit includes an internal compensation circuit that samples a threshold voltage Vth of the driving element DT using a plurality of switch elements M1 to M6 and stores the voltages in a capacitor Cst, and compensates for the gate voltage of the driving element DT by the threshold voltage Vth of the driving element DT. Each of the driving element DT and the switch elements M1 to M6 can be implemented as a p-channel TFT.

A driving period of the pixel circuit can be divided into an initialization period Tini, a sampling period Tsam, and an emission period Tem, as shown in FIG. 9.

The Nth scan pulse SCAN(N) is generated at the gate-on voltage VGL in the sampling period Tsam and applied to the first gate line GL1. The $(N-1)^{th}$ scan pulse SCAN(N-1) is generated at the gate-on voltage VGL in the initialization period Tini prior to the sampling period and is applied to the second gate line GL2. An emission control pulse (hereinafter, referred to as "EM pulse") EM(N) is generated at the gate-off voltage VGH in the initialization period Tini and the sampling period Tsam and is applied to the third gate line GL3.

During the initialization period Tini, the $(N-1)^{th}$ scan pulse SCAN(N-1) is generated at the gate-on voltage VGL, and the voltage of each of the Nth scan pulse SCAN(N) and the EM pulse EM(N) is the gate-off voltage VGH/VEH. During the sampling period Tsam, the Nth scan pulse SCAN(N) is generated at the gate-on voltage VGL, and the voltage of each of the (N-1)th scan pulse SCAN(N-1) and the EM pulse EM(N) is the gate-off voltage VGH/VEH. During at least a part of the emission period Tem, the EM pulse EM(N) is generated at the gate-on voltage VEL, and the voltage of each of the (N-1)th scan pulse SCAN(N-1) and the Nth scan pulse SCAN(N) is the gate-off voltage VGH.

During the initialization period Tini, the fifth switch element M5 is turned on in response to the gate-on voltage VGL of the (N-1)th scan pulse SCAN(N-1) to initialize the pixel circuit. During the sampling period Tsam, the first and second switch elements M1 and M2 are turned on in response to the gate-on voltage VGL of the Nth scan pulse SCAN(N), so that the data voltage Vdata compensated by the threshold voltage of the driving element DT is stored in the capacitor Cst1. In addition, the sixth switch element M6 is turned on during the sampling period Tsam to lower the voltage of the fourth node n4 to the reference voltage VREF, thereby suppressing light emission of the light emitting element EL.

When the light emission period Tem starts, the EM line GL3 is inverted to the gate-on voltage VGL. During the light emission period Tem, the scan lines GL1 and GL2 maintain the gate-off voltage VGH. During the light emission period Tem, since the third and fourth switch elements M3 and M4 are turned on, the light emitting element EL can emit light. During the light emission period Tem, in order to accurately express the luminance of low grayscale, a voltage level of the EM pulse EM(N) can be reversed at a predetermined duty ratio between the gate-on voltage VGL and the gate-off voltage VGH. In this case, the third and fourth switch elements M3 and M4 can repeatedly turn on/off according to the duty ratio of the EM pulse EM(N) during the light emission period Tem.

The anode of the light emitting element EL is connected to the fourth node n4 between the fourth and sixth switch elements M4 and M6. The fourth node n4 is connected to the anode of the light emitting element OLED, a second electrode of the fourth switch element M4, and a second electrode of the sixth switch element M6. The cathode of the light-emitting element EL is connected to the VSS line PL3 to which the low potential power supply voltage ELVSS is applied. The light emitting element EL emits light with a current Ids flowing according to a gate-source voltage Vgs of the driving element DT. A current path of the light emitting element EL is switched by the third and fourth switch elements M3 and M4.

The storage capacitor Cst is connected between the VDD line PL1 and the second node n2. The data voltage Vdata compensated by the threshold voltage Vth of the driving element DT is charged in the capacitor Cst. Since the data voltage Vdata in each of the sub-pixels is compensated by the threshold voltage Vth of the driving device DT, the characteristic deviation of the driving device DT in the sub-pixels is compensated.

The first switch element M1 is turned on in response to the gate-on voltage VGL of the Nth scan pulse SCAN(N) to connect the second node n2 to the third node n3. The second node n2 is connected to a gate electrode of the driving element DT, a first electrode of the capacitor Cst, and a first electrode of the first switch element M1. The third node n3 is connected to a second electrode of the driving element DT, a second electrode of the first switch element M1, and a first electrode of the fourth switch element M4. A gate electrode of the first switch element M1 is connected to the Nth scan line GL1 to receive the Nth scan pulse SCAN(N). The first electrode of the first switch element M1 is connected to the second node n2, and the second electrode of the first switch element M1 is connected to the third node n3.

Since the first switch element M1 is turned on during very short one horizontal period (1H) in which the Nth scan signal SCAN(N) is generated as the gate-on voltage VGL in one frame period, a leakage current may occur in an off state. In order to restrain the leakage current of the first switch element M1, the first switch element M1 can be implemented with a transistor having a dual gate structure in which two transistors are connected in series.

The second switch element M2 is turned on in response to the gate-on voltage VGL of the Nth scan pulse SCAN(N) to supply the data voltage Vdata to the first node n1. A gate electrode of the second switch element M2 is connected to the Nth scan line GL1 to receive the Nth scan pulse SCAN(N). A first electrode of the second switch element M2 is connected to the first node n1. The second electrode of the second switch element M2 is connected to the data lines DL of the first region DA to which the data voltage Vdata is applied. The first node n1 is connected to the first electrode of the second switch element M2, a second electrode of the third switch element M3, and a first electrode of the driving element DT The third switch element M3 is turned on in response to the gate-on voltage VGL of the EM pulse EM(N) to connect the VDD line PL1 to the first node n1. A gate electrode of the third switch element M3 is connected to the EM line GL3 to receive the EM pulse EM(N). A first electrode of the third switch element M3 is connected to the VDD line PL1. The second electrode of the third switch element M3 is connected to the first node n1.

The fourth switch element M4 is turned on in response to the gate-on voltage VGL of the EM pulse EM(N) to connect the third node n3 to the anode of the light emitting element OLED. A gate electrode of the fourth switch element M4 is connected to the EM line GL3 to receive the EM pulse EM(N). The first electrode of the fourth switch element M4 is connected to the third node n3, and the second electrode is connected to the fourth node n4.

The fifth switch element M5 is turned on in response to the gate-on voltage VGL of the N-1th scan pulse SCAN(N-1) to connect the second node n2 to the Vini line PL2. A gate electrode of the fifth switch element M5 is connected to the N-1th scan line GL2 to receive the N-1th scan pulse SCAN (N-1). A first electrode of the fifth switch element M5 is connected to the second node n2, and a second electrode is connected to the Vini line PL2. In order to restrain the leakage current of the fifth switch element M5, the fifth switch element M5 is implemented with a transistor having a dual gate structure in which two transistors are connected in series.

The sixth switch element M6 is turned on in response to the gate-on voltage VGL of the Nth scan pulse SCAN(N) to connect the Vini line PL2 to the fourth node n4. A gate electrode of the sixth switch element M6 is connected to the Nth scan line GL1 to receive the Nth scan pulse SCAN(N). A first electrode of the sixth switch element M6 is connected to the Vini line PL2, and a second electrode of the sixth switch element M6 is connected to the fourth node n4.

In another embodiment, the gate electrodes of the fifth and sixth switch elements M5 and M6 can be commonly connected to the N-1th scan line GL2 to which the N-1th scan pulse SCAN(N-1) is applied. In this case, the fifth and sixth switch elements M5 and M6 can be simultaneously turned on in response to the N-1th scan pulse SCAN(N-1).

The driving element DT drives the light emitting element EL by controlling the current flowing through the light emitting element EL according to the gate-source voltage Vgs. The driving element DT includes the gate connected to the second node n2, the first electrode connected to the first node n1, and the second electrode connected to the third node n3. In FIG. 9, "DTG" is the gate voltage of the driving element DT, that is, the voltage of the second node n2.

It should be noted that the configuration of the pixel circuit present in the display devices of the present disclosure is not limited to the examples of FIGS. 6 to 8. For example, the data voltage Vdata can be applied to the gate electrode of the driving element DT or applied to the first electrode or the second electrode of the driving element DT. The gamma characteristic curve of the data voltage Vdata can be set as a positive gamma curve or an inverse gamma curve according to the channel characteristic of the driving element DT or an electrode to which the data voltage Vdata is applied. The data voltage Vdata can be applied to the first electrode or the second electrode of the n-channel driving element DT or the data voltage Vdata can be applied to the gate electrode of the p-channel driving element DT. The data voltage Vdata applied to the gate electrode of the n-channel driving element DT is a voltage determined by the positive gamma curve. The data voltage Vdata applied to the first electrode or the second electrode of the n-channel driving element DT is a voltage determined by the inverse gamma curve. The data voltage Vdata applied to the gate electrode of the p-channel driving element DT is a voltage determined by the inverse gamma curve. The data voltage Vdata applied to the first electrode or the second electrode of the p-channel driving element DT is a voltage determined by the positive gamma curve.

Figure 10:
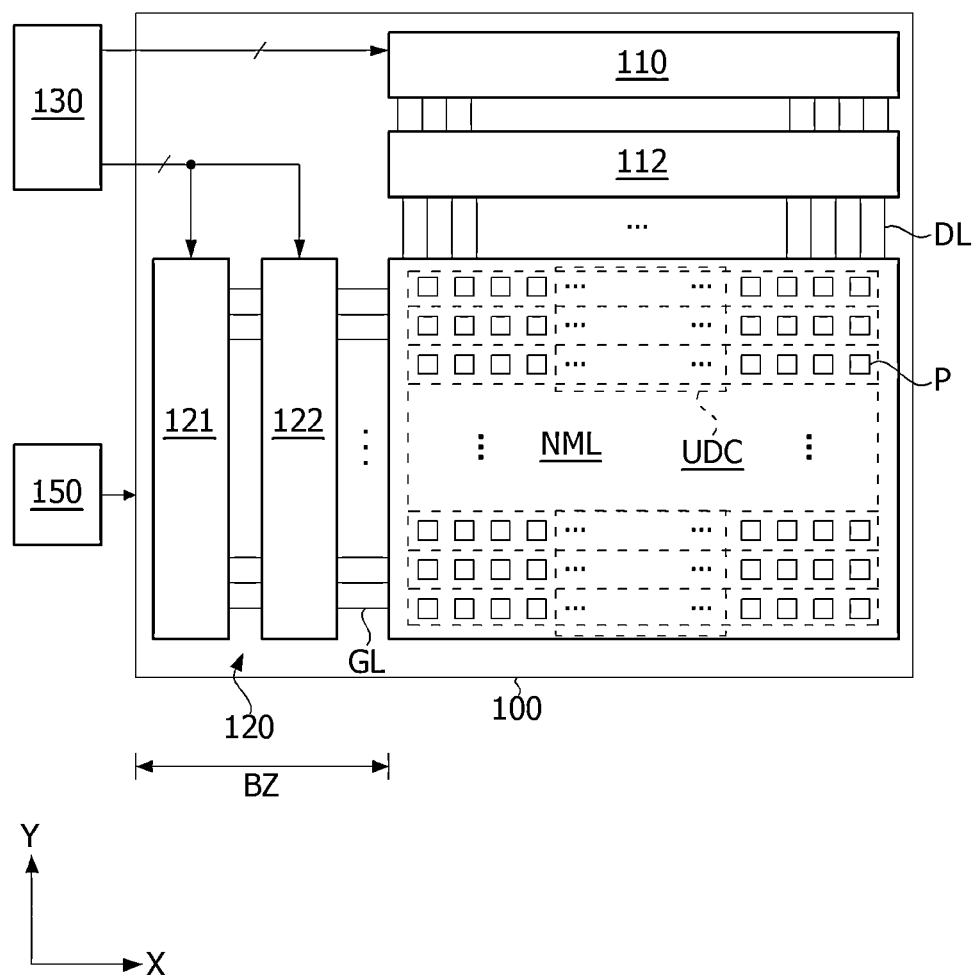
FIG. 10 is a block diagram illustrating a display device according to an embodiment of the present disclosure.

FIG. 10 is a block diagram showing a display device according to an embodiment of the present disclosure.

Referring to FIG. 10, a display device according to an embodiment of the present disclosure includes the display panel 100, a display panel driver 110 and 120 for writing pixel data of an input image to pixels P of the display panel 100, a timing controller 130 for controlling the display panel driver, and a power supply unit 150 for generating power required to drive the display panel 100.

The display panel 100 includes a pixel array that displays an input image on the screen. As described above, the pixel array may be divided into the first pixel area NML and the second pixel area UDC. Each of sub-pixels of the pixel array may drive the light emitting element EL using the pixel circuits shown in FIGS. 6 to 8. As a variation, the pixel array can include one or more first pixel areas DAs and one or more second pixel areas CAs.

Touch sensors can be disposed on the screen of the display panel 100. The touch sensors can be implemented as on-cell type or add-on type touch sensors disposed on the screen of the display panel or can be implemented as in-cell type touch sensors embedded in the pixel array.

The display panel 100 can be implemented as a flexible display panel in which the pixels P are disposed on a flexible substrate such as a plastic substrate or a metal substrate. In the flexible display, the size and shape of the screen can be changed by winding, folding, or bending the flexible display panel. The flexible display can include a slidable display, a rollable display, a bendable display, a foldable display, etc.

The display panel drivers reproduce the input image on the screen of the display panel 100 by writing the pixel data of the input image to the sub-pixels. The display panel drivers include the data driver 110 and the gate driver 120. The display panel drivers can further include a demultiplexer 112 disposed between the data driver 110 and data lines DL.

Each display panel driver can operate in a low-speed driving mode under the control of the timing controller 130. In the low-speed driving mode, power consumption of the display device can be reduced when the input image does not change for a preset time by analyzing the input image. In the low-speed driving mode, when a still image is input for a predetermined time or longer, power consumption can be reduced by lowering a refresh rate of the pixels P and controlling the data writing period of the pixels P to be longer. The low-speed driving mode is not limited when the still image is input. For example, when the display device operates in a standby mode or when a user command or an input image is not input to the display panel driving circuit for a predetermined time or more, the display panel driving circuit can operate in the low-speed driving mode.

The data driver 110 receives the pixel data of the input image, which is digital data, and generates a data voltage Vdata using a digital-to-analog converter (hereinafter referred to as "DAC"). The DAC receives the pixel data, which is digital data, and receives a gamma reference voltage from a gamma voltage generator of the power supply unit 150. The data driver 110 divides the gamma reference voltage into gamma compensation voltages respectively corresponding to the grayscales of the pixel data by using a voltage divider circuit. The DAC of the data driver 110 is disposed in each of the channels of the data driver 110. The DAC converts the pixel data into the gamma compensation voltage by using a switch element array that selects a voltage in response to a bit of the pixel data, and outputs the data voltage Vdata. The data voltage Vdata outputted from each of the channels of the data driver 110 may be supplied to the data lines DL of the display panel 100 through the demultiplexer 112.

The demultiplexer 112 time-divides and distributes the data voltage Vdata output through the channels of the data driver 110 to the plurality of data lines DL. The number of channels of the data driver 110 can be reduced due to the demultiplexer 112. The demultiplexer 112 can be omitted. In this case, the channels of the data driver 110 are directly connected to the data lines DL.

The gate driver 120 can be implemented as a gate in panel (GIP) circuit that is directly formed on a bezel region BZ of the display panel 100 together with a TFT array of the pixel array. The gate driver 120 outputs gate signals to gate lines GL under the control of the timing controller 130. The gate driver 120 can sequentially supply the gate signals to the gate lines GL by shifting the gate signals using a shift register. The voltage of the gate signal swings between the gate-off voltage VGH and the gate-on voltage VGL. The gate signal can include the scan pulse, the EM pulse, the sensing pulse, etc., shown in FIGS. 6 to 8.

The gate driver 120 can be disposed on each of the left and right bezels (or two opposite sides) of the display panel 100 to supply the gate signal to the gate lines GL in a double feeding method. In the double feeding method, the gate drivers 120 on both sides are synchronized so that the gate signals can be simultaneously applied from both ends of one gate line. In another exemplary embodiment, the gate driver 120 can be disposed on any one of the left and right bezels (or two opposite sides) of the display panel 100 and can supply the gate signals to the gate lines GL in a single feeding method.

The gate driver 120 may include a first gate driver 121 and a second gate driver 122. The first gate driver 121 outputs a scan pulse and a sensing pulse, and shifts the scan pulse and the sensing pulse according to the shift clock. The second gate driver 122 outputs the EM pulse and shifts the EM pulse according to the shift clock. In the case of a bezel-free model, at least some of the switch elements constituting the first and second gate drivers 121 and 122 may be distributedly disposed in the pixel array.

The timing controller 130 receives pixel data of an input image and a timing signal synchronized with the pixel data from the host system. The timing signal includes a vertical synchronization signal Vsync, a horizontal synchronization signal Hsync, a clock CLK, a data enable signal DE, etc. One period of the vertical synchronization signal Vsync is one frame period. One period of each of the horizontal synchronization signal Hsync and the data enable signal DE is one horizontal period 1H. The pulse of the data enable signal DE is synchronized with one-line data to be written to the pixels P of one pixel line. Since the frame period and the horizontal period can be known by counting the data enable signal DE, the vertical synchronization signal Vsync and the horizontal synchronization signal Hsync may be omitted.

The timing controller 130 transmits the pixel data of the input image to the data driver 110, and synchronizes the data driver 110, the demultiplexer 112, and the gate driver 120. The timing controller 130 can include a data operator that receives sensing data obtained from the pixels P in the display panel driver to which the external compensation technology is applied and modulates the pixel data. In this case, the timing controller 130 can transmit the pixel data modulated by the data operator to the data driver 110.

The timing controller 130 can control the operation timing of the display panel drivers 110, 112, and 120 at a frame frequency of an input frame frequency×i Hz (i is a positive integer greater than 0) by multiplying the input frame frequency by i times. The input frame frequency is 60 Hz in the National Television Standards Committee (NTSC) scheme and 50 Hz in the Phase-Alternating Line (PAL) scheme. The timing controller 130 can lower the frame frequency to a frequency between 1 Hz and 30 Hz to lower the refresh rate of the pixels P in the low-speed driving mode.

The timing controller 130 generates a data timing control signal for controlling the operation timing of the data driver 110, a switch control signal for controlling the operation timing of the demultiplexer 112, and a gate timing control signal for controlling the operation timing of the gate driver 120 based on the timing signals Vsync, Hsync, and DE received from the host system.

The voltage level of the gate timing control signal outputted from the timing controller 130 may be converted to the gate high voltage VGH/VEH and the gate low voltage VGL/VEL through a level shifter omitted from the drawing, and it may be supplied to the gate driver 120. The level shifter receives a clock of the gate timing control signal from the timing controller 130 and outputs a timing signal, such as a start pulse and a shift clock, necessary for driving the gate driver 120. The low level voltage of the gate timing control signal inputted to the level shifter may be converted to the gate low voltage VGL through the level shifter, and the high level voltage of the gate timing control signal may be converted to the gate high voltage VGH/VEH.

The power supply unit 150 may include a charge pump, a regulator, a buck converter, a boost converter, a gamma voltage generation circuit, and the like. The power supply unit 150 adjusts a DC input voltage from the host system to generate power required to drive the display panel 100 and the display panel driver. The power supply unit 150 may output DC voltages such as the gamma reference voltage, the gate-off voltage VGH/VEH, the gate-on voltage VGL/VEL, the pixel driving voltage ELVDD, the low potential power voltage ELVSS, the initialization voltage Vini, and the reference voltage VREF.

The gamma voltage generation circuit may be implemented with a programmable gamma IC (P-GMA IC). The programmable gamma IC may vary the gamma reference voltage depending on a register setting. The gamma reference voltage is supplied to the data driver 110. The gate-off voltage VGH/VEH and the gate-on voltage VGL/VEL are supplied to the level shifter and the gate driver 120. The pixel driving voltage ELVDD, the low potential power voltage ELVSS, the initialization voltage Vini, and the reference voltage VREF are commonly supplied to the pixel circuits through the power lines. The pixel driving voltage ELVDD is set to be higher than the low potential power voltage ELVSS, the initialization voltage Vini, and the reference voltage VREF.

Figure 11:
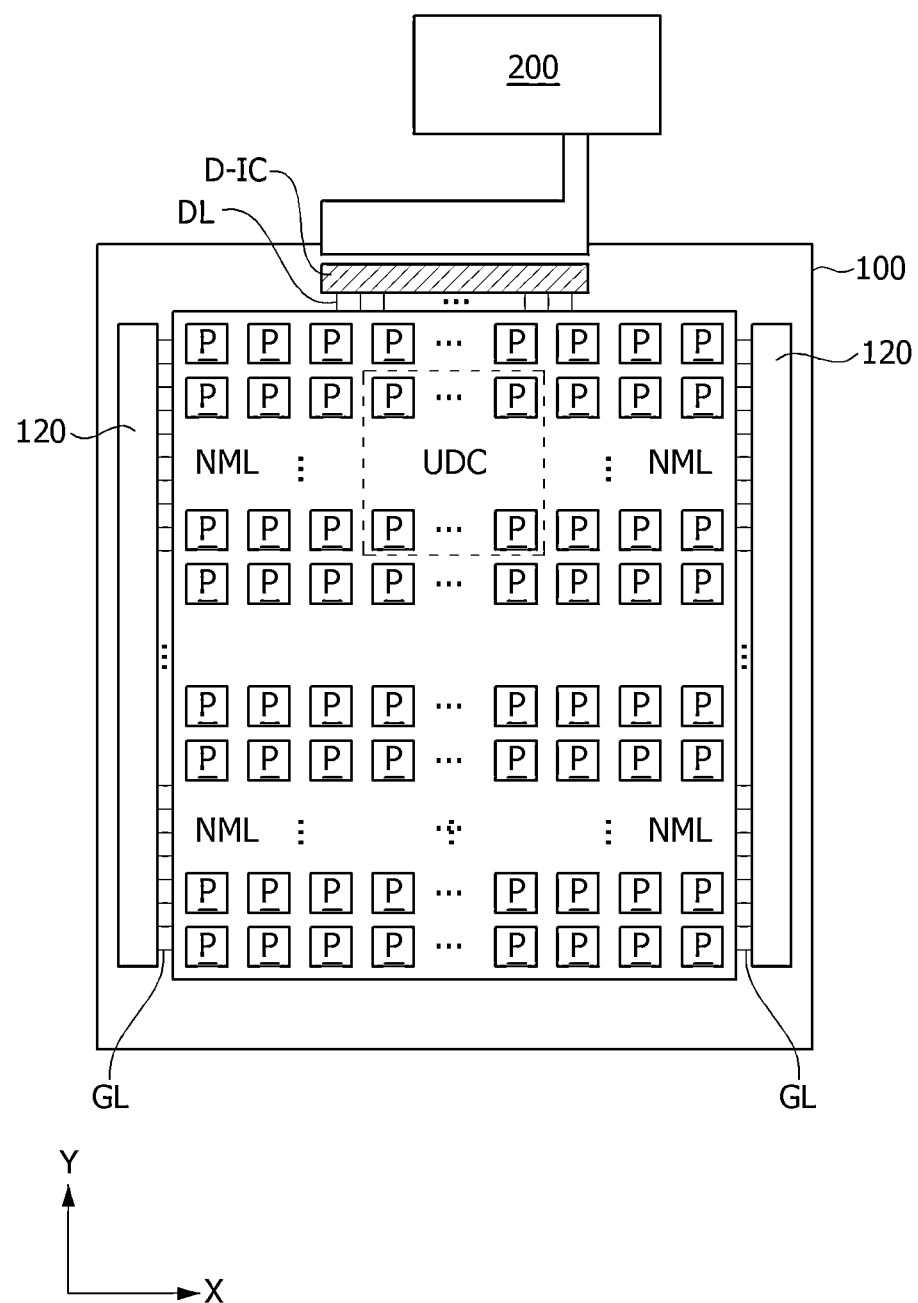
FIG. 11 is a diagram illustrating an example in which a display device is applied to a mobile device according to an embodiment of the present disclosure.

The host system may be a main circuit board of a television (TV) system, a set-top box, a navigation system, a personal computer (PC), a vehicle system, a home theater system, a mobile device, or a wearable device. In the mobile device or the wearable device, as shown in FIG. 11, the timing controller 130, the data driver 110, and the power supply unit 150 may be integrated into one drive integrated circuit (D-IC). In FIG. 11, reference numeral "200" denotes the host system. The host system 200 includes an authentication module. The authentication module may execute a facial recognition algorithm that processes user authentication by comparing facial pattern data received from the infrared camera 202 with preset feature points of a user's facial pattern. The authentication module may be software stored in hardware (e.g., a processor circuit) to process user authentication.

In the present disclosure, in order to reduce the difference in luminance and color of the boundary pixel area BDR, as shown in FIGS. 12A and 12B, the unit emission regions UA and UA' of the same size are defined in the second pixel area UDC and the boundary pixel area BDR, and the unit emission region UA' of the boundary pixel area BDR is divided into the first emission region BA and a second emission region BB whose luminance is controlled differently.

FIG. 12A is a plan view illustrating the unit emission region UA of the second pixel area UDC according to an embodiment of the present disclosure. FIG. 12B is a plan view illustrating a first emission region and a second emission region of the boundary pixel area BDR according to an embodiment of the present disclosure. In FIGS. 12A and 12B, "R" denotes an R sub-pixel, "G" denotes a G sub-pixel, and "B" denotes a B sub-pixel.

As shown in FIGS. 5A and 5B, the second pixel area UDC includes the pixel groups PG spaced apart by a predetermined distance. The second pixel area UDC has a repeatability in which the unit emission region UA including one pixel group PG is regularly arranged along the X axis and the Y axis.

Each of the unit emission regions UA in the second pixel area UDC includes an emission region A and a non-emission region NA disposed around the emission region A. The emission region A may include at least one pixel, or two or more sub-pixels having different colors, and may include two or more color emission regions. Each of the sub-pixels may drive a light emitting element of one color emission region. In the second pixel area UDC, the plurality of emission regions A are spaced apart from each other by a distance corresponding to the length of the unit emission region UA, and the non-emission region NA is positioned between the emission regions A. The non-emission region NA may include the light transmitting portion AG, having no pixel.

The boundary pixel area BDR includes the unit emission region UA' having the same size as the unit emission region UA. The unit emission region UA' includes the first emission region BA set to have the same size as the emission region A of the unit emission region UA, and the second emission region BB set to have the same size as the non-emission region NA of the unit emission region UA. Each of the first emission region BA and the second emission region BB may include at least one pixel, or at least two or more sub-pixels having different colors, and may include two or more color emission regions. Each of the sub-pixels may drive a light emitting element of one color emission region.

Each of the first and second emission regions BA and BB may have one or more pixels disposed therein to include an emission region. At least one of the second emission regions BB may be disposed between adjacent first emission regions BA. The luminance of the first emission regions BA and the luminance of the second emission regions BB may be controlled differently, e.g., to be opposite to each other.

In the boundary pixel area BDR, the numbers of sub-pixels of the same color in the first and second emission regions BA and BB satisfy an integer multiple relationship. For example, in FIG. 12B, the number of sub-pixels for each color in the second emission region BB is three times that of the same color in the first emission region BA. In FIG. 12B, the first emission region BA of the unit emission region UA' includes two R sub-pixels, four G sub-pixels, and two B sub-pixels. The second emission region BB of the unit emission region UA' includes six R sub-pixels, twelve G sub-pixels, and six B sub-pixels.

Meanwhile, as shown in FIG. 5B, in a part of the boundary pixel area BDR adjacent to the second pixel area UDC, the second emission region BB may not include a pixel and a color emission region.

As shown in FIG. 12A, in one unit emission region UA, the emission region A occupies approximately 25%, but is not limited thereto. For example, the emission region A may be set to occupy approximately 25% to 75% in one unit emission region UA.

FIGS. 13 to 16 are diagrams illustrating various embodiments of the second pixel area UDC and the boundary pixel area BDR according to an embodiment of the present disclosure.

Referring to FIGS. 13 to 16, the unit emission region UA' of the boundary pixel area BDR may include more sub-pixels than the unit emission region UA of the second pixel area UDC. The sub-pixels disposed in the unit emission region UA' of the boundary pixel area BDR may include an emission region having a different shape from an emission region of the sub-pixels disposed in the unit emission region UA of the second pixel area UDC. The number and shape of the sub-pixels disposed in the unit emission region UA' of the boundary pixel area BDR may be the same as those of the sub-pixels disposed in the same size in the first pixel area NML. Each of the sub-pixels disposed in the unit emission region UA of the second pixel area UDC has a larger and different shape than the sub-pixels disposed in the unit emission region UA' of the boundary pixel area BDR in the same color.

Figure 13:
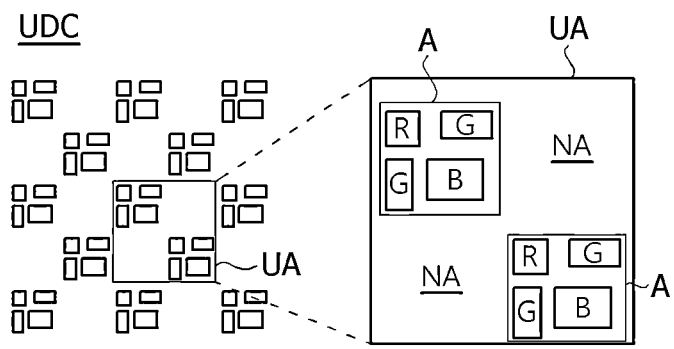
FIGS. 13 to 16 are diagrams illustrating various embodiments of a second pixel area UDC and a boundary pixel area BDR according to an embodiment of the present disclosure.
Figure 13:
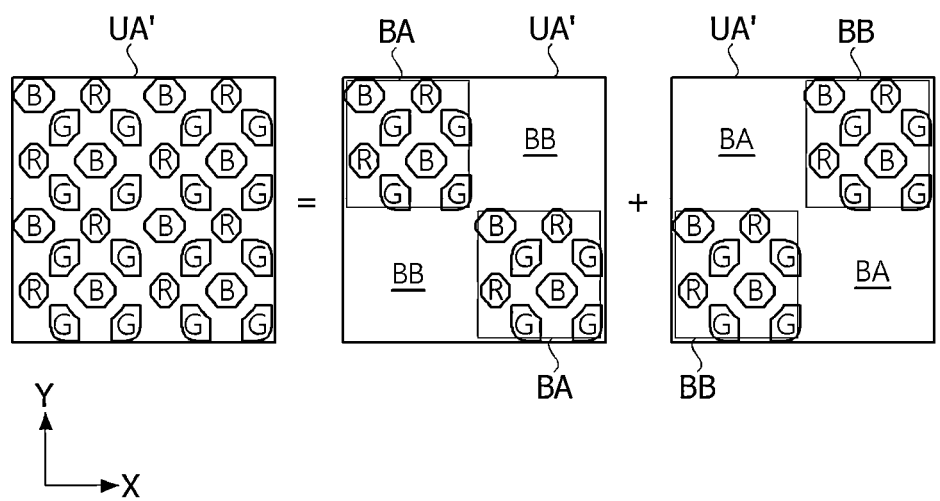

In the example of FIG. 13, the unit emission region UA of the second pixel area UDC may include two emission regions A. An area occupied by the two emission regions A may be approximately ½ in the unit emission region UA. Each of the emission regions A may include one R sub-pixel, two G sub-pixels, and one B sub-pixel. Each of the sub-pixels disposed in the emission region A may include a square or rectangular color emission region. The R sub-pixel of the second pixel area UDC may be larger than the R sub-pixel of the boundary pixel area BDR, and the G sub-pixel of the second pixel area UDC may be larger than the G sub-pixel of the boundary pixel area BDR. In addition, the B sub-pixel of the second pixel area UDC may be larger than the B sub-pixel of the boundary pixel area BDR.

In the example of FIG. 13, the unit emission region UA' and the first emission region BA in the boundary pixel area BDR have the same shape and the same size as the unit emission region UA and the emission region A in the second pixel area UDC, respectively. In the unit emission region UA' of the boundary pixel area BDR, the first emission region BA and the second emission region BB may each occupy approximately ½ of the unit emission region.

In the boundary pixel area BDR, ⅓ areas of the first emission region BA and the second emission region BB having the same size may include two R sub-pixels, four G sub-pixels, and two B sub-pixels. Each of the sub-pixels disposed in the first emission region BA and the second emission region BB may include a rhombus shaped or parallelogram shaped color emission region.

Figure 14:
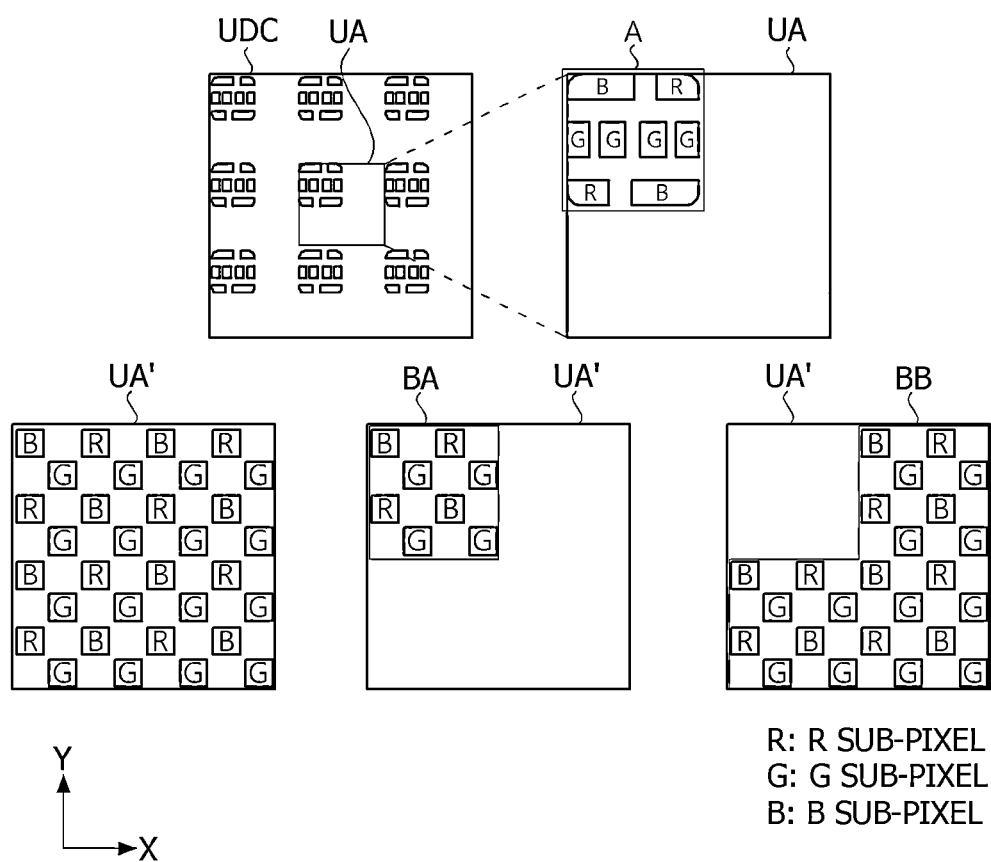

In the example of FIG. 14, the unit emission region UA of the second pixel area UDC may include one emission region A. An area occupied by one emission region A may be approximately ¼ in the unit emission region UA. Each of the emission regions A may include two R sub-pixel, four G sub-pixels, and two B sub-pixel. The G sub-pixels disposed in the emission region A may each include a square or rectangular color emission region, and the R and B sub-pixels may each include a wedge-shaped color emission region with an inclined corner. The R sub-pixel of the second pixel area UDC may be larger than the R sub-pixel of the boundary pixel area BDR, and the B sub-pixel of the second pixel area UDC may be larger than the B sub-pixel of the boundary pixel area BDR. The G sub-pixel of the second pixel area UDC may be equal to or larger than the G sub-pixel of the boundary pixel area BDR.

In the example of FIG. 14, the unit emission region UA' and the first emission region BA of the boundary pixel area BDR have the same shape and the same size as the unit emission region UA and the emission region A of the second pixel area UDC, respectively. In the unit emission region UA' of the boundary pixel area BDR, an area occupied by the first emission region BA may be approximately ¼, and an area occupied by the second emission region BB may be approximately ¾.

In the boundary pixel area BDR, ⅓ areas of the first emission region BA and the second emission region BB having the same size may include two R sub-pixels, four G sub-pixels, and two B sub-pixels. Each of the sub-pixels disposed in the first emission region BA and the second emission region BB may include a square or rectangular color emission region.

Figure 15:
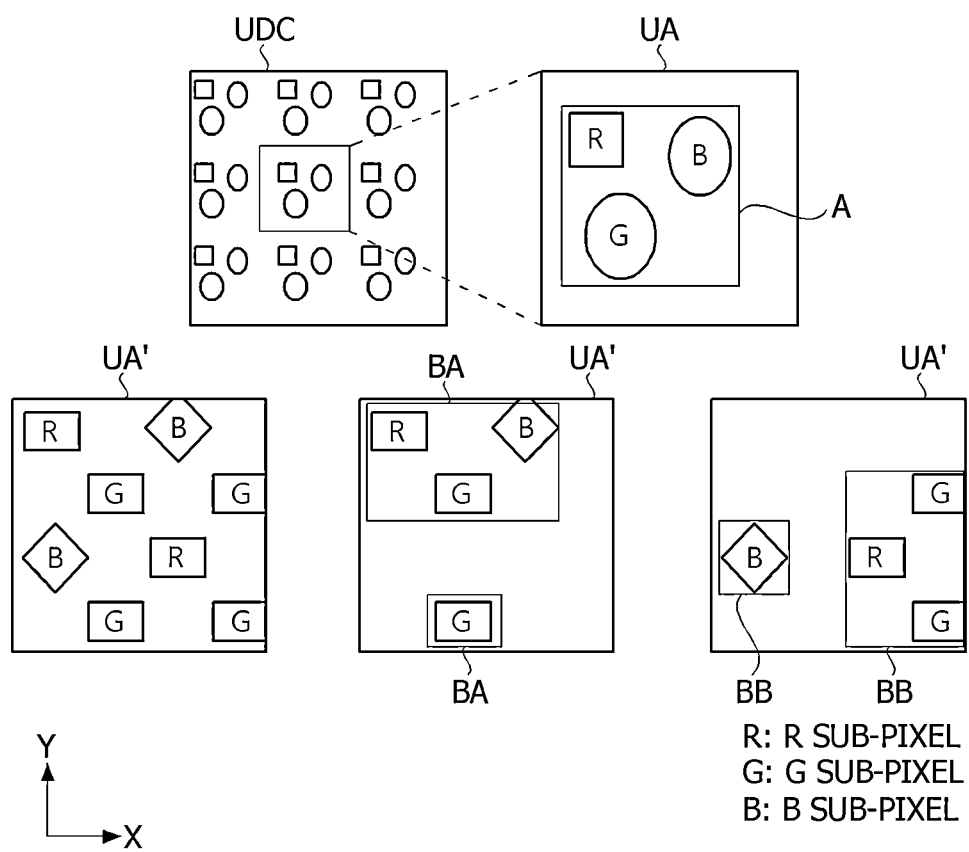

In the example of FIG. 15, the unit emission region UA of the second pixel area UDC may include one emission region A. An area occupied by one emission region A may be approximately ½ in the unit emission region UA. The emission region A may include one R sub-pixel, one G sub-pixel, and one B sub-pixel. Each of the sub-pixels disposed in the emission region A may include a square, octagonal, circular, or elliptical color emission region. The R sub-pixel of the second pixel area UDC may be larger than the R sub-pixel of the boundary pixel area BDR, and the G sub-pixel of the second pixel area UDC may be larger than the G sub-pixel of the boundary pixel area BDR. In addition, the B sub-pixel of the second pixel area UDC may be larger than the B sub-pixel of the boundary pixel area BDR.

In the example of FIG. 15, the unit emission region UA' and the first emission region BA of the boundary pixel area BDR have the same size as the unit emission region UA and the emission region A of the second pixel area UDC, respectively. In the unit emission region UA' of the boundary pixel area BDR, the first emission region BA and the second emission region BB may each occupy approximately ½ of the unit emission region.

In the unit emission region UA' of the boundary pixel area BDR, the first emission region BA and the second emission region BB may each include one R sub-pixel, two G sub-pixels, and one B sub-pixel. Each of the sub-pixels disposed in the first and second emission regions BA and BB may include a rhombic or rectangular emission region for each color.

Figure 16:
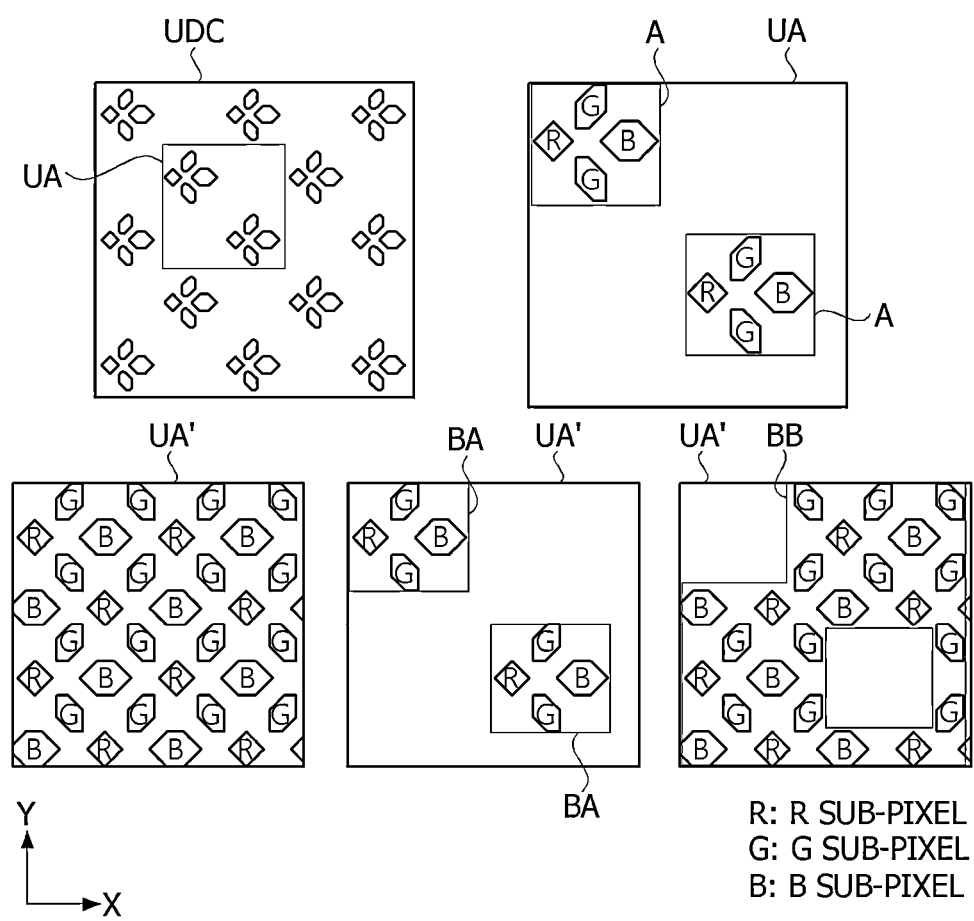

As can be seen from FIGS. 13 to 15, at least one of the number, size, and shape of the sub-pixels disposed in the unit emission region UA of the second pixel area UDC may be designed differently from that of the boundary pixel area BDR. In addition, as shown in FIG. 16, the number, size, and shape of the sub-pixels disposed in the unit emission region UA of the second pixel area UDC may be designed to be the same as or similar to that of the boundary pixel area BDR.

The host system 200 or the timing controller 130 may control the luminance of the first emission region BA and the second emission region BB of the boundary pixel area BDR to be different from each other.

Figure 17:
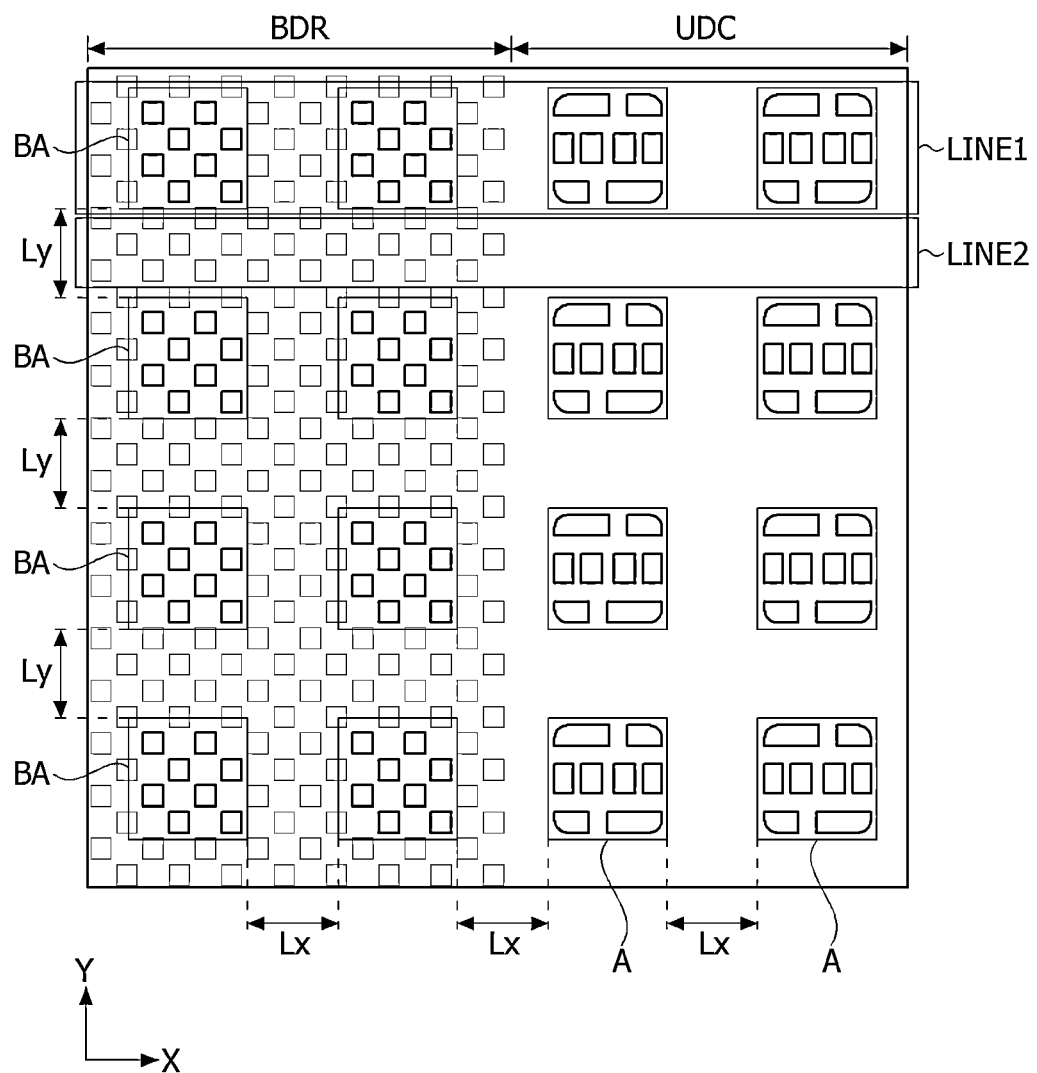
FIG. 17 is a diagram illustrating an example in which a spatial period of unit emission regions of a boundary pixel area is the same as a spatial period of unit emission regions of a second pixel area according to an embodiment of the present disclosure.

FIG. 17 is a diagram illustrating an example in which a spatial period of unit emission regions of a boundary pixel area is the same as a spatial period of unit emission regions of a second pixel area according to an embodiment of the present disclosure.

Referring to FIG. 17, the unit emission regions UA' of the boundary pixel area BDR are defined to have substantially the same size as the unit emission regions UA of the second pixel area UDC. In the boundary pixel area BDR, a distance or gap Lx, Ly between the first emission regions BA adjacent in each of the first direction (X-axis) and the second direction (Y-axis) is set to be equal to or similar to a distance Lx, Ly between the emission regions A of the second pixel area UDC. In other words, at a boundary between the boundary pixel area BDR and the second pixel area UDC, a separation distance between the first emission region BA of the boundary pixel area BDR and the emission region A of the second pixel area UDC may be constant. A distance Lx, Ly between the first emission region BA of the boundary pixel area BDR and the emission region A of the second pixel area UDC existing at the boundary between the boundary pixel area BDR and the second pixel area UDC is equal to or similar to the distance Lx, Ly between the emission regions A of the second pixel area UDC. Accordingly, a light emission spatial period of bright pixels in the boundary pixel area BDR close to the second pixel area may become substantially the same as that of the second pixel area UDC, so that a sense of the heterogeneity for the boundary pixel area BDR may be reduced.

As shown in FIG. 17, the second emission region BB of low luminance is disposed between the emission region A of the second pixel area UDC and the first emission region BA of the boundary pixel area BDR to secure the separation distance Lx, Ly.

As shown in FIG. 17, the second pixel area UDC and the boundary pixel area BDR includes a first line LINE1 on which bright emission regions A and BA and the relatively dark areas NA and BB are arranged along the first direction X, and a second line LINE2 on which the relatively dark areas NA and BB are arranged along the first direction X. The first emission regions BA and the second emission regions BB are alternately arranged on the first line LINE1 of the boundary pixel area BDR. The second emission regions BB are continuously arranged on the second line LINE2 of the boundary pixel area BDR, without the first emission region BA.

Figure 18:
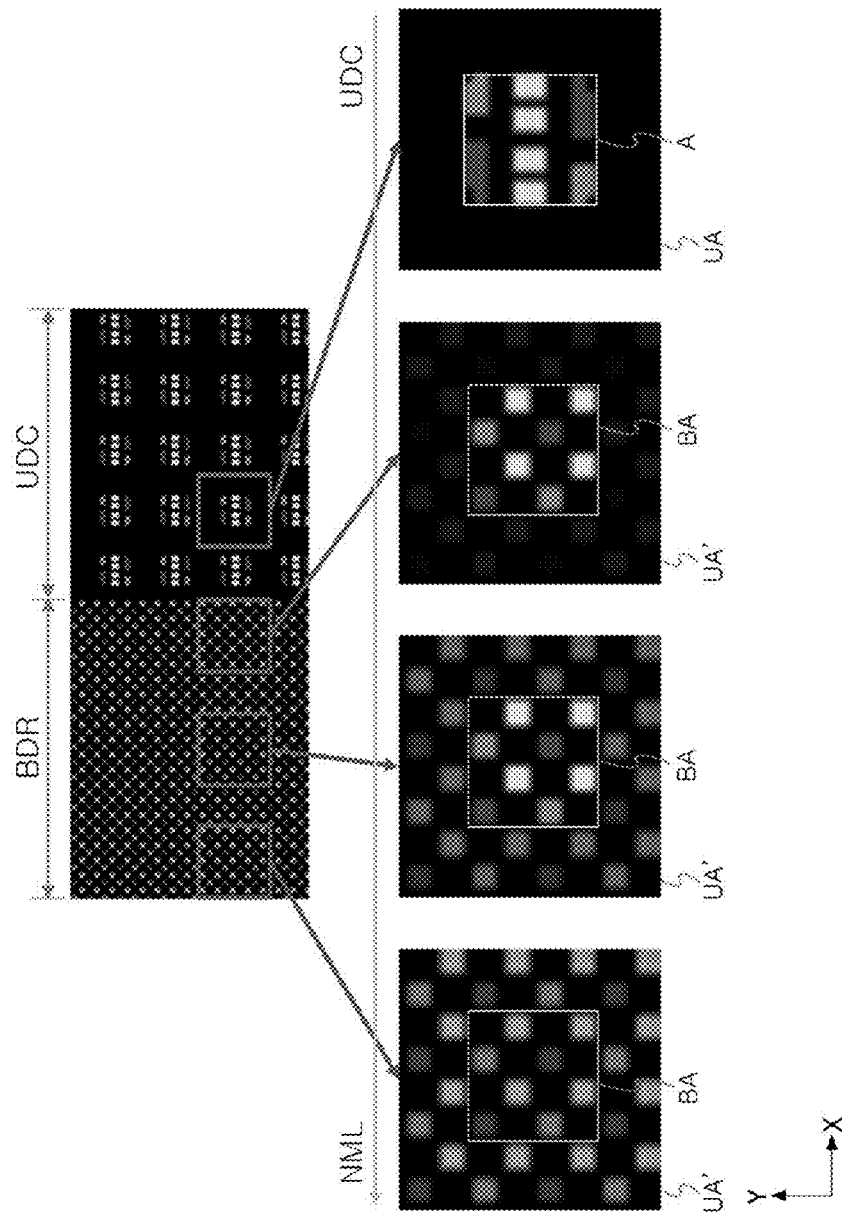
FIG. 18 is a diagram illustrating an example in which the luminances of a first emission region and a second emission region of a boundary pixel area are gradually changed to be opposite to each other between a first pixel area and a second pixel area according to an embodiment of the present disclosure.

FIG. 18 is a diagram illustrating an example in which the luminance of the first emission region BA and the second emission region BB of the boundary pixel area BDR between the first pixel area NML and the second pixel area UDC is gradually changed to be opposite to each other according to an embodiment of the present disclosure.

Referring to FIG. 18, the maximum luminance of the first emission region BA in the boundary pixel area BDR decreases to a level equal to or similar to the maximum luminance of the first pixel area NML, as the distance from the second pixel area UDC increases, that is, as the distance to the first pixel area NML decreases. In the boundary pixel area BDR, the maximum luminance of the sub-pixels of the second emission region BB disposed around the first emission region BA increases to a level equal to or similar to the maximum luminance of the first pixel area NML, as the distance from the second pixel area UDC increases, that is, as the distance to the first pixel area NML decreases. Accordingly, since the average luminance of the unit emission regions UA and UA' between the first pixel area NML and the second pixel area UDC may be the same or almost the same, it is possible to prevent the boundary pixel area BDR from appearing in the form of a bright line or a dark line.

The maximum luminance of the second pixel area UDC may be set to be higher than the maximum luminance of the first pixel area NML. As can be seen from FIGS. 19B and 20B, the maximum luminance of the first emission regions BA in the boundary pixel area BDR may be less than the maximum luminance of the second pixel area UDC and higher than the maximum luminance of the first pixel area NML. The maximum luminance of the second emission regions BB in the boundary pixel area BDR may be less than the maximum luminance of the second pixel area UDC and less than the maximum luminance of the first pixel area NML.

Figure 19A:
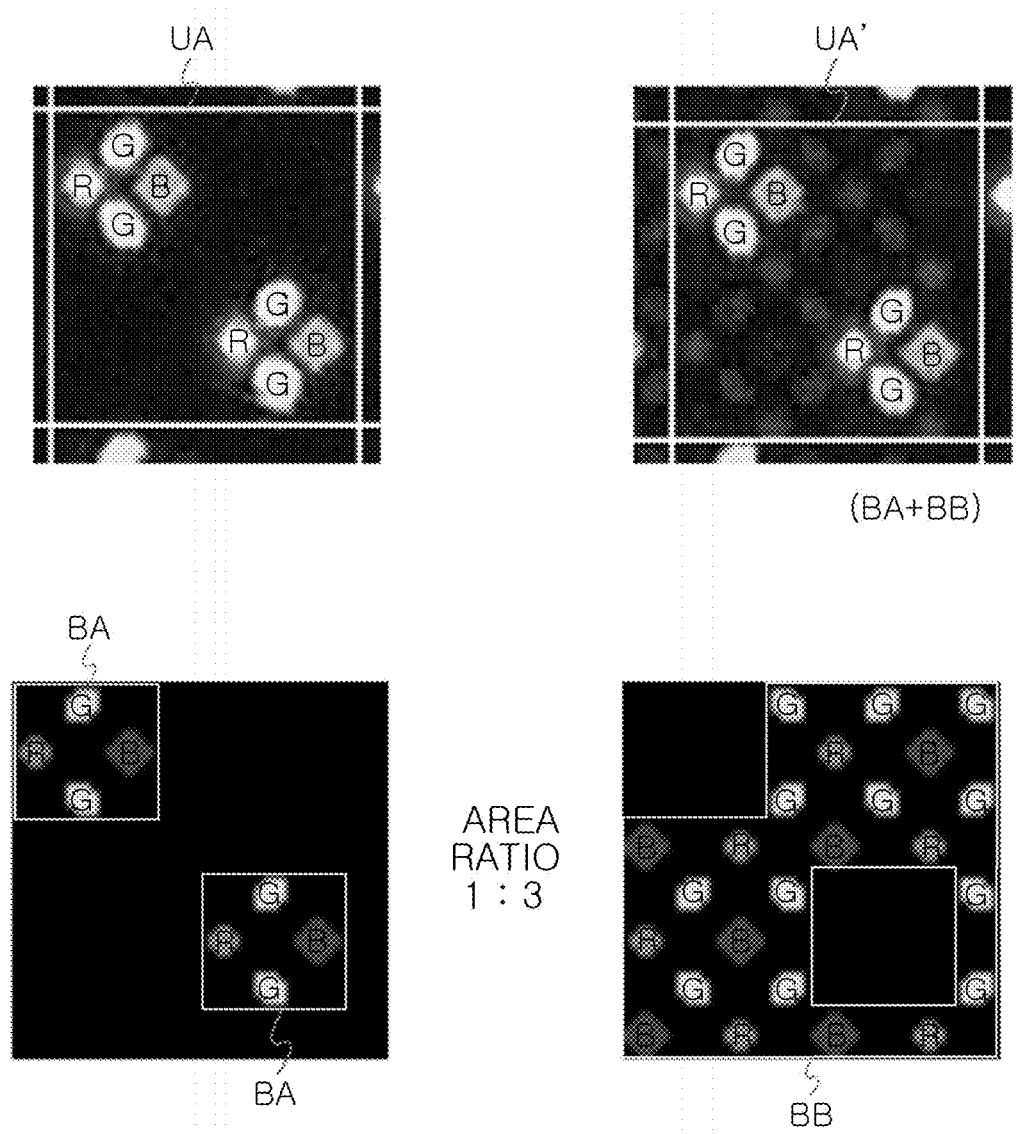
FIG. 19A is a diagram illustrating an example of an area ratio between a first emission region and a second emission region in a boundary pixel area according to an embodiment of the present disclosure.

FIG. 19A is a diagram illustrating an example of an area ratio between the first emission region BA and the second emission region BB in the boundary pixel area BDR. In FIG. 19A, "BA+BB" indicates a pixel group including the first emission region BA that emits light with high luminance and the second emission region BB that emits light with low luminance within the unit pixel area UA' of the boundary pixel area BDR. In the example of FIG. 19A, the sub-pixel arrangement of the first emission region BA is the same as that of the unit emission region UA of the second pixel area UDC. In the example of FIG. 19A, the area ratio of the first emission region BA to the second emission region BB is approximately 1:3.

Figure 19B:
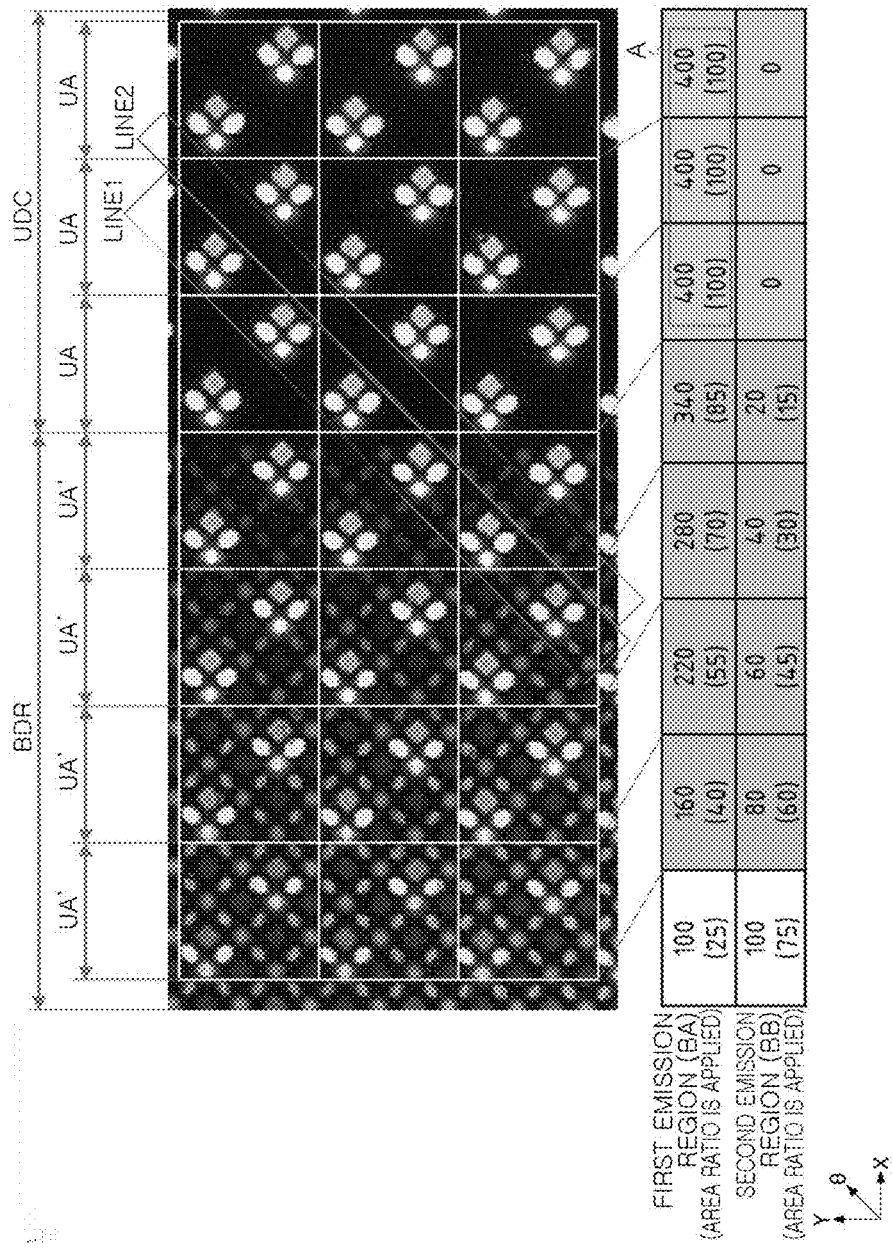
FIG. 19B is a diagram illustrating an example of a method for controlling the luminance of unit emission regions as in FIG. 19A according to an embodiment of the present disclosure.

FIG. 19B is a diagram illustrating an example of a method for controlling luminance of the unit emission regions UA and UA' as in FIG. 19A according to an embodiment of the present disclosure. In FIG. 19B, numbers outside parentheses indicate maximum luminance, and numbers within parentheses indicate luminance contribution rates (%) of the unit emission regions UA and UA' to which the area ratio is applied.

As shown in FIG. 19B, the second pixel area UDC and the boundary pixel area BDR includes a first line LINE1 on which bright emission regions A and BA and relatively dark areas NA and BB are arranged along a diagonal direction θ between the first direction X and the second direction Y, and a second line LINE2 on which the relatively dark areas NA and BB are arranged along the diagonal direction θ. The first emission regions BA and the second emission regions BB are alternately arranged on the first line LINE1 of the boundary pixel area BDR. The second emission regions BB are continuously arranged on the second line LINE2 of the boundary pixel area BDR, without the first emission region BA.

Figure 20A:
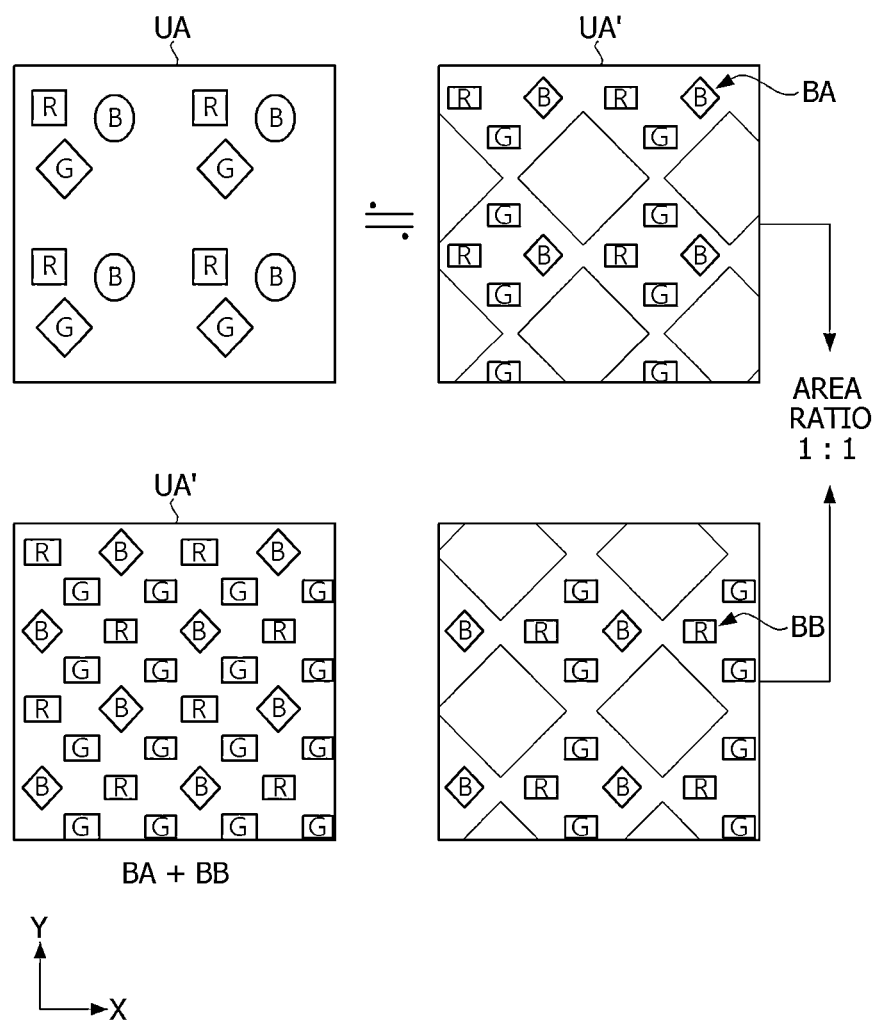
FIG. 20A is a diagram illustrating another example of an area ratio between a first emission region and a second emission region in a boundary pixel area according to an embodiment of the present disclosure.

FIG. 20A is a diagram illustrating another example of an area ratio between the first emission region BA and the second emission region BB of the boundary pixel area BDR according to an embodiment of the present disclosure. In FIG. 20A, "BA+BB" indicates a pixel group including the first emission region BA and the second emission region BB that emit light with high luminance within the unit pixel area UA' of the boundary pixel area BDR. In the example of FIG. 20A, the sub-pixel arrangement of the first emission region BA is different from that of the unit emission region UA of the second pixel area UDC. In the example of FIG. 20A, the area ratio of the first emission region BA to the second emission region BB is approximately 1:1.

Figure 20B:
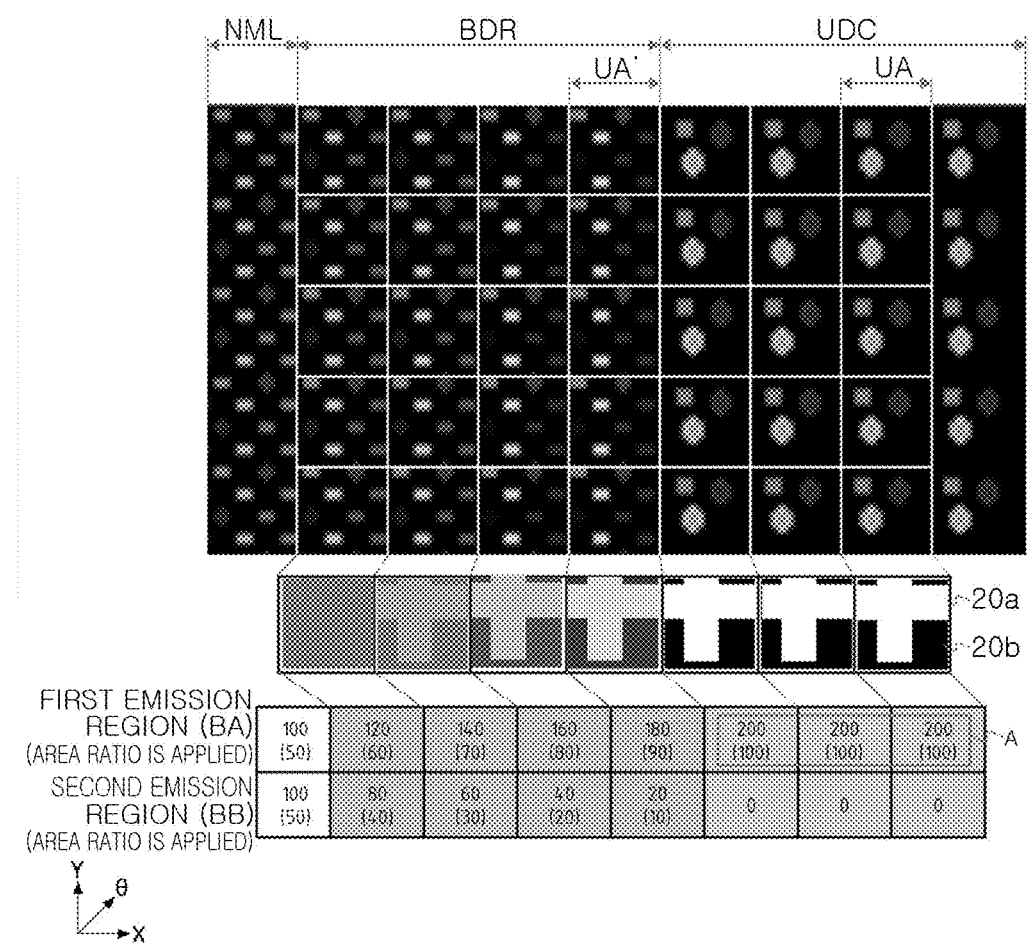
FIG. 20B is a diagram illustrating an example of a method for controlling the luminance of unit emission regions as in FIG. 20A according to an embodiment of the present disclosure.

FIG. 20B is a diagram illustrating an example of a method for controlling luminance of the unit emission regions UA and UA' as in FIG. 20A according to an embodiment of the present disclosure. In FIG. 20B, numbers outside parentheses indicate maximum luminance, and numbers within parentheses indicate luminance contribution rates (%) of the unit emission regions UA and UA' to which the area ratio is applied.

Figure 21:
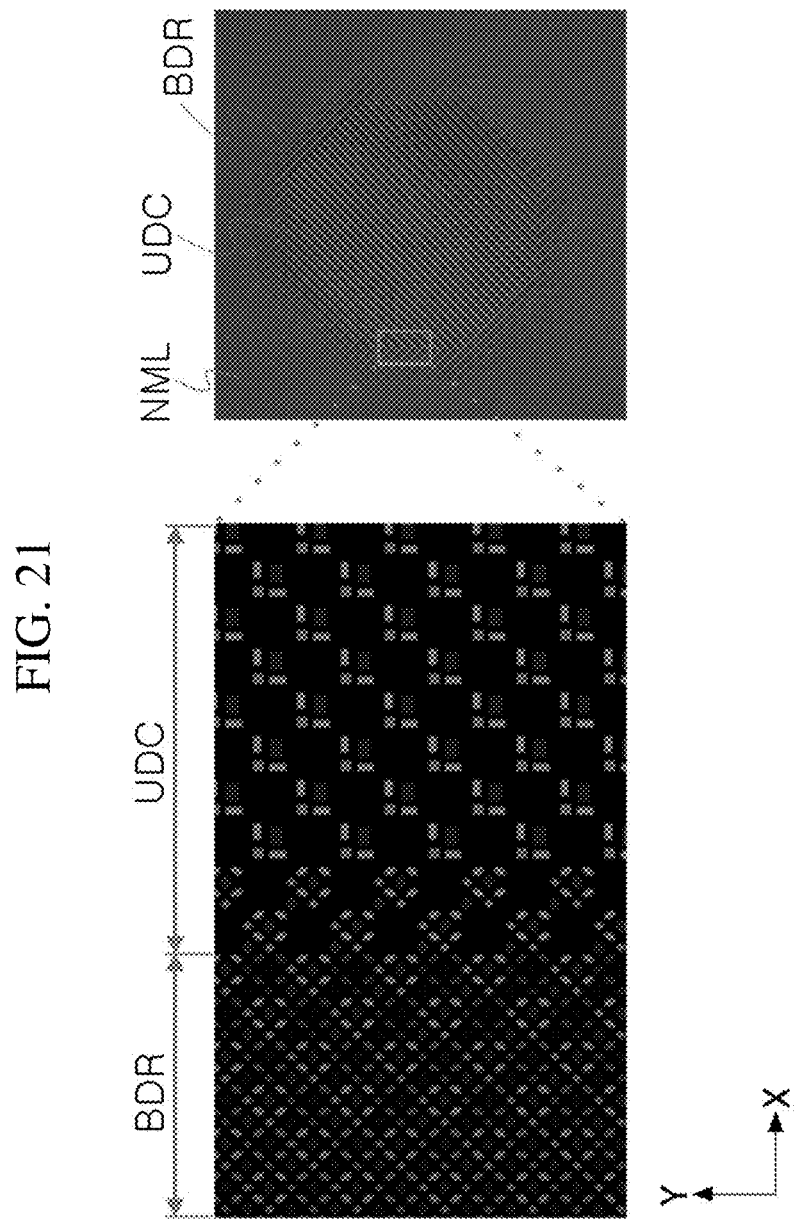
FIGS. 21 and 22 are diagrams illustrating the effect of improving the sense of heterogeneity of the boundary pixel area according to an embodiment of the present disclosure.
Figure 22:
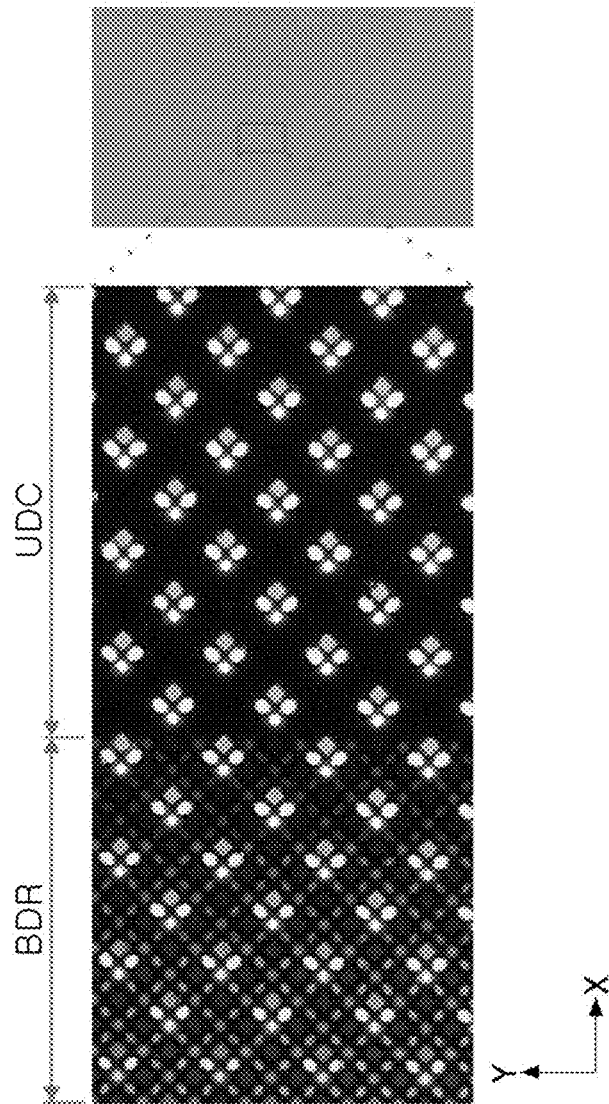
Figure 23:
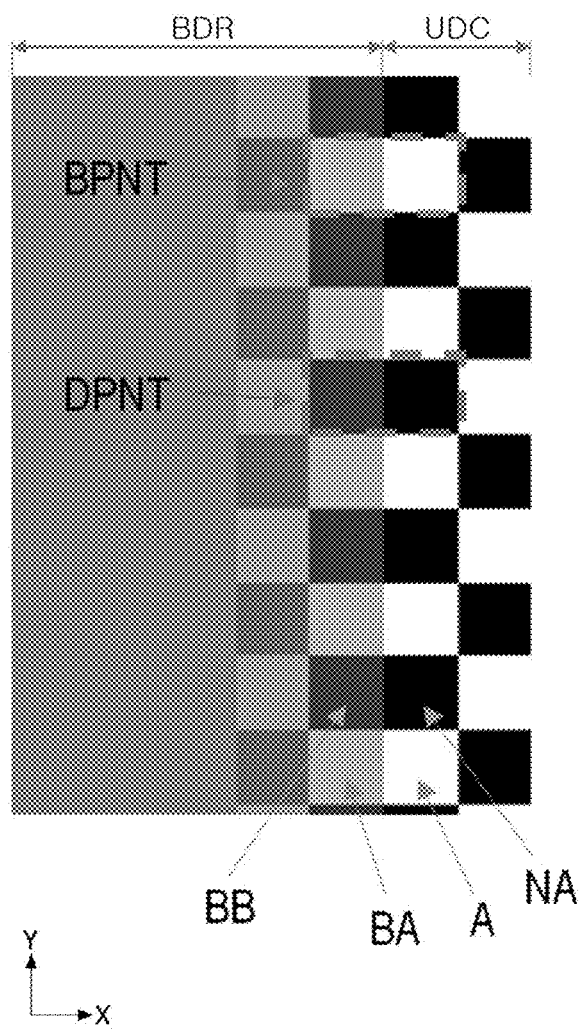
FIG. 23 is a diagram illustrating a comparative example in which high luminance emission regions are adjacent to each other and low luminance emission regions are adjacent to each other at a left boundary of a second pixel area according to an embodiment of the present disclosure.
Figure 24:
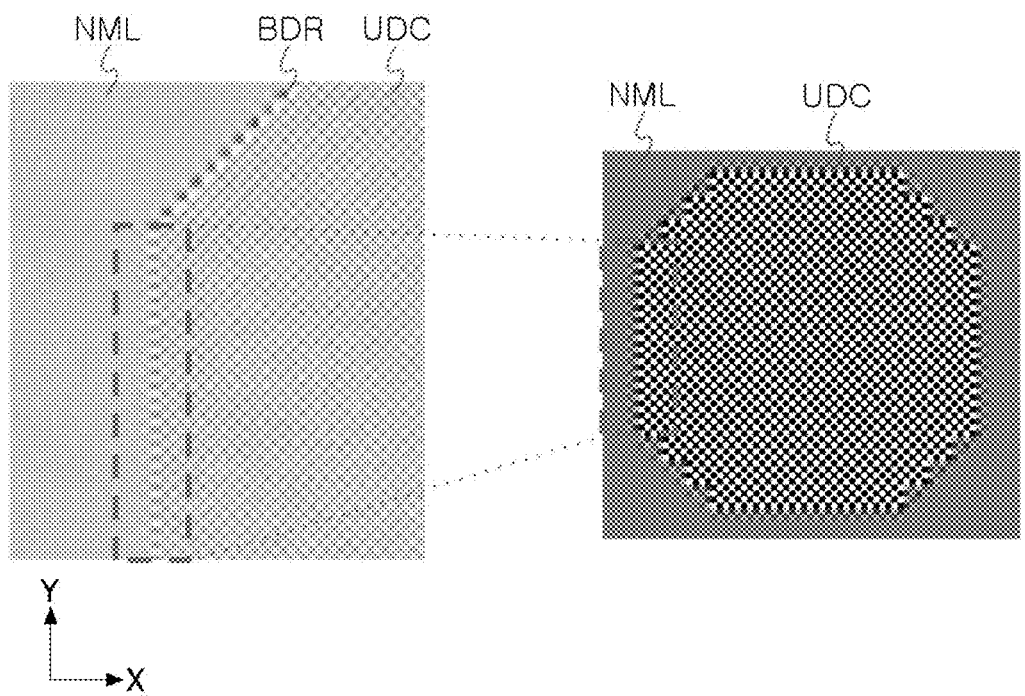
FIG. 24 is an enlarged view illustrating a left boundary of a second pixel area in a simulation for a comparative example.
Figure 25:
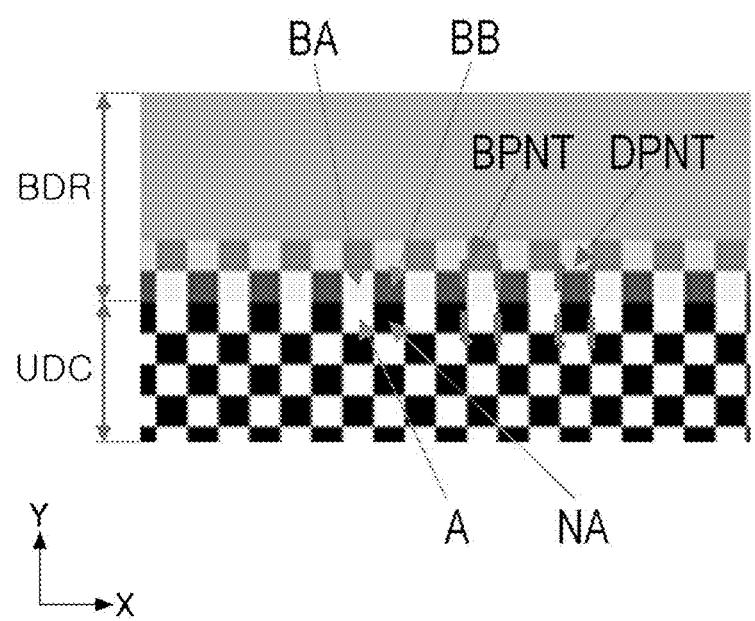
FIG. 25 is a diagram illustrating a comparative example in which high luminance emission regions are adjacent to each other and low luminance emission regions are adjacent to each other at an upper boundary of a second pixel area.
Figure 26:
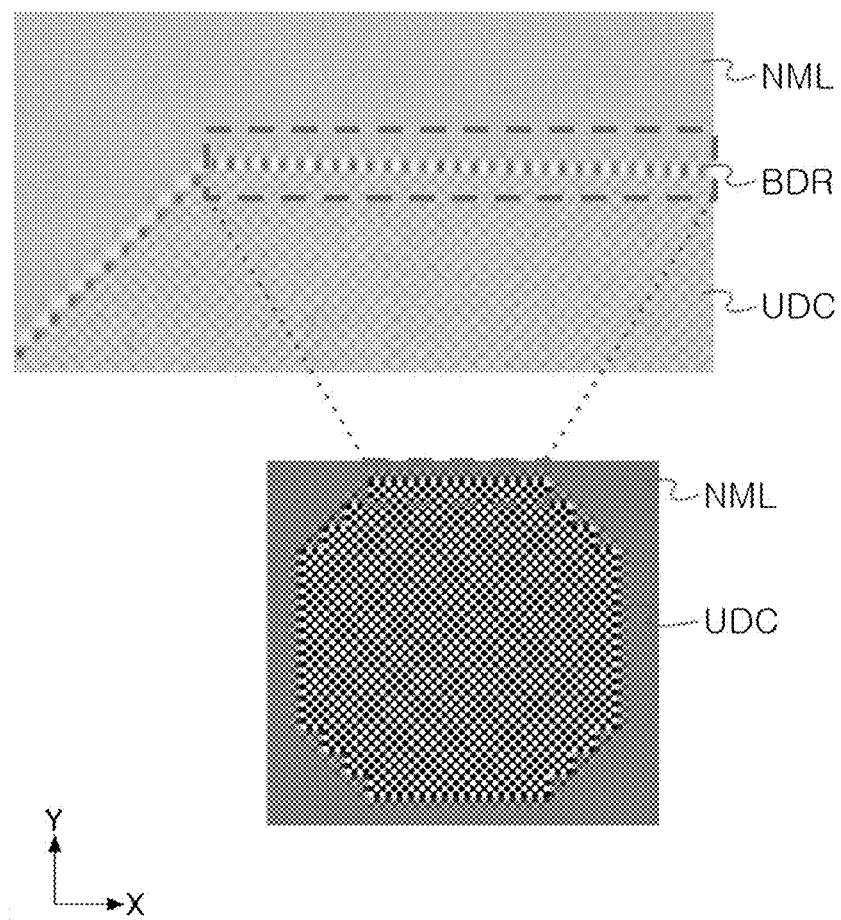
FIG. 26 is an enlarged view illustrating an upper boundary of a second pixel area in a simulation for a comparative example.

Referring to FIGS. 19A to 20B, the maximum luminance of the first emission region BA in the boundary pixel area BDR may gradually decreases as the distance to the first pixel area NML decreases. On the other hand, the maximum luminance of the second emission region BB in the boundary pixel area BDR gradually increases as the distance from the second pixel area UDC increases, that is, as the distance to the first pixel area NML decreases. A maximum luminance difference between the first emission region BA and the second emission region BB decreases as the distance from the second pixel area UDC increases. As described above, the maximum luminance of the first emission regions BA in the boundary pixel area BDR may be less than the maximum luminance of the second pixel area UDC and greater than the maximum luminance of the first pixel area NML. The maximum luminance of the second emission regions BB in the boundary pixel area BDR may be less than the maximum luminance of the second pixel area UDC and less than the maximum luminance of the first pixel area NML. Such a method for controlling the luminance of the first and second emission regions BA and BB may improve a sense of heterogeneity for the boundary pixel area BDR as shown in FIGS. 21 and 22. The left image of FIG. 21 is a part of a screen picture captured when the pixels as in FIG. 13 emit light with a middle grayscale, and the right diagram thereof shows the pixels of the second pixel area UDC and the boundary pixel area BDR adjacent thereto. The left image of FIG. 22 is a part of a screen picture captured when the pixels as in FIG. 16 emit light with a middle grayscale, and the right diagram thereof shows the pixels of the second pixel area UDC and the boundary pixel area BDR adjacent thereto.

In the second pixel area UDC, only the sub-pixels of the emission region A emit light. Accordingly, the luminance contribution rate of the emission region A in the second pixel area UDC is 100%. The luminance contribution rate of the first emission region BA and the second emission region BB in the boundary pixel area BDR may be calculated with their maximum luminance and area ratio.

As in the example of FIG. 19A, when the area ratio of the first emission region BA to the second emission region BB is 1:3, the luminance contribution rate of the first emission region BA is a value obtained by multiplying the maximum luminance by ¼. The luminance contribution rate of the second emission region BB is a value obtained by multiplying the maximum luminance by ¾. Here, ¼ is a ratio of the area occupied by the first emission region BA within the unit emission region UA', and ¾ is a ratio of the area occupied by the second emission region BB within the unit emission region UA'. The luminance of the unit emission region UA' is a value obtained by adding the luminance of the first emission region BA and the luminance of the second emission region BB. Accordingly, the sum of the luminance contribution rate (%) of the first emission region BA and the luminance contribution rate (%) of the second emission region BB is 100% in the unit emission region UA'. For example, in the unit emission region UA' adjacent to the first pixel area NML, the luminance contribution rate of the first emission region BA is 160*(¼)=40%, and the luminance contribution rate of the second emission region BB is 80*(¾)=60%. In the unit emission region UA' adjacent to the second pixel area UDC, the luminance contribution rate of the first emission region BA is 340*(¼)=85%, and the luminance contribution rate of the second emission region BB is 20*(¾)=15%.

As in the example of FIG. 20A, when the area ratio of the first emission region BA to the second emission region BB is 1:1, the luminance contribution rate of the first emission region BA is a value obtained by multiplying the maximum luminance by ½. Similarly, the luminance contribution rate of the second emission region BB is a value obtained by multiplying the maximum luminance by ½. In the example of FIGS. 20A and 20B, in the unit emission region UA' adjacent to the first pixel area NML, the luminance contribution rate of the first emission region BA is 120*(½)=60%, and the luminance contribution rate of the second emission region BB is 80*(½)=40%. In the unit emission region UA' adjacent to the second pixel area UDC, the luminance contribution rate of the first emission region BA is 180*(½) =90%, and the luminance contribution rate of the second emission region BB is 20*(½)=10%. The middle diagram in FIG. 20B shows a high luminance 20*a* and a low luminance 20*b* in grayscale levels in the unit emission regions UA and UA'.

Meanwhile, in a comparative example shown in FIGS. 23 to 26, in the second pixel area UDC and the boundary pixel area BDR, the emission regions A and BA of high luminance may be disposed adjacent to each other with almost no gap, or the emission region BB of low luminance or the non-emission region NA may be disposed adjacent to each other with almost no gap. In the comparative example, in the boundary pixel area BDR between the first pixel area NML and the second pixel area UDC, bright spots BPNT appear conspicuously since bright pixels are adjacent to each other, and dark spots BPNT appear conspicuously since dark pixels are adjacent to each other. In this comparative example, bright spots and dark spots are periodically seen in the boundary pixel area BDR, so that the user feels a sense of heterogeneity. In contrast, in the embodiments of the present disclosure, at the boundary between the boundary pixel area BDR and the second pixel area UDC in each of the first and second directions X and Y, the separation distance Lx, Ly between the first emission region BA of the boundary pixel area BDR and the emission region A of the second pixel area UDC is constant, so that the boundary pixel area BDR is not visually recognized and the user does not feel a sense of heterogeneity with respect to the boundary pixel area BDR.

Figure 27:
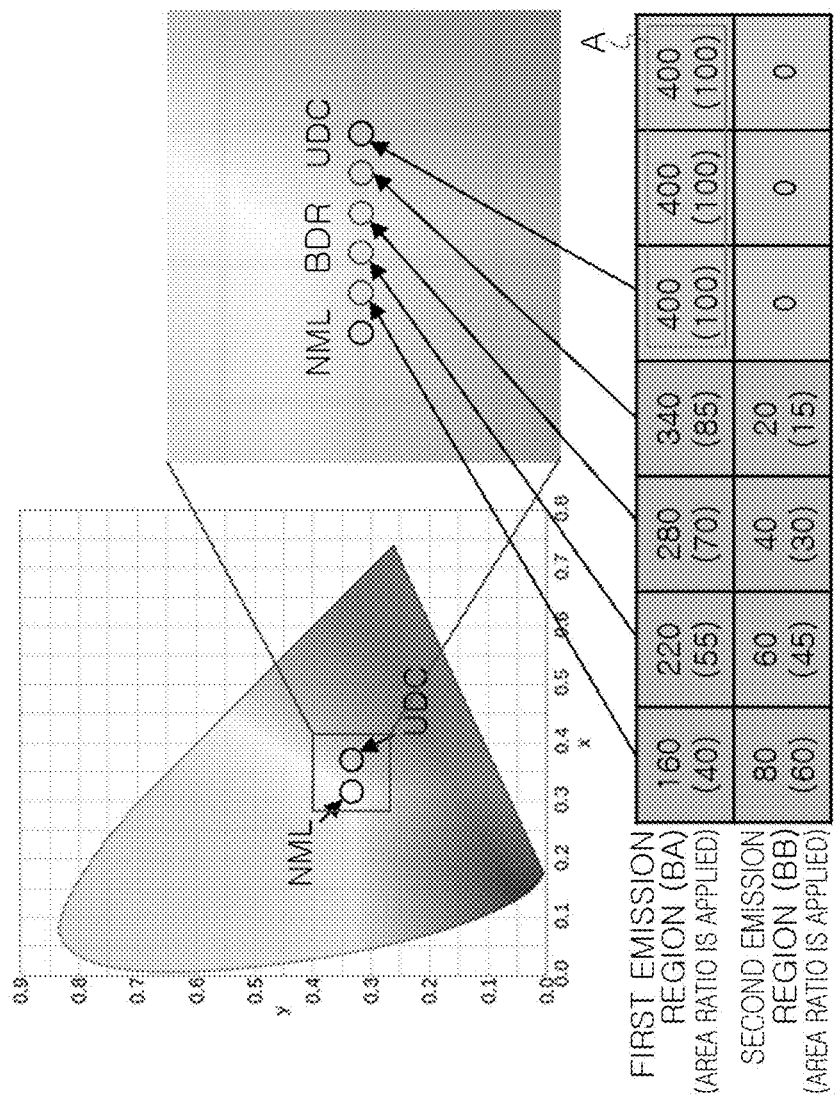
FIG. 27 is a diagram illustrating an effect of improving a color difference in a boundary pixel area according to an embodiment of the present disclosure.

In the boundary pixel area BDR, the pixels of the first emission region BA and the pixels of the second emission region BB may emit light by gamma compensation curves having different maximum luminances. The second emission region BB may emit light with luminance defined by a first gamma compensation curve having maximum luminance equal to or less than the maximum luminance of the first pixel area NML. The first emission region BA may emit light with luminance defined by a second gamma compensation curve having maximum luminance equal to or less than the maximum luminance of the second pixel area UDC. The maximum luminance defined by the second gamma compensation curve may be higher than that of the first gamma compensation curve. As described above, the pixels of the first and second emission regions BA and BB emit light by the first and second gamma compensation curves having different maximum luminances within the boundary pixel area BDR. As a result, even if a difference in color between the first pixel area NML and the second pixel area UDC is recognized due to a difference in color coordinates between them, as shown in FIG. 27, the color difference may be improved by the effect (gradation effect) of gradually changing color coordinate values as well as luminance.

Figure 28:
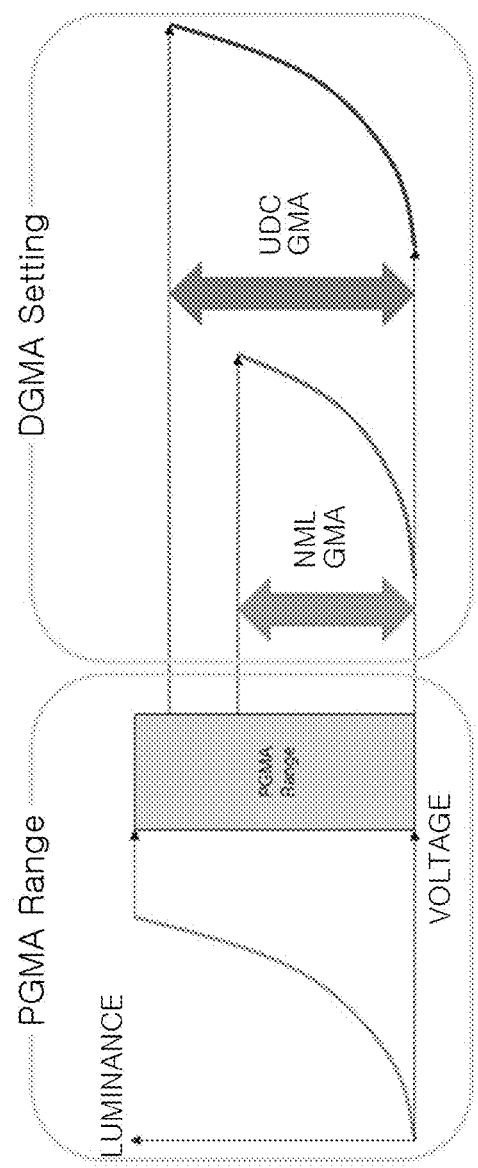
FIG. 28 is a diagram illustrating an example of a single gamma reference voltage range and gamma compensation curves according to an embodiment of the present disclosure.

The maximum luminance of the pixels may be controlled using a digital gamma technique and an analog gamma technique. In the present disclosure, heterogeneous gamma compensation curves having different maximum luminances may be used by using heterogeneous gamma compensation voltages. For example, as shown in FIG. 28, a programmable gamma IC may generate gamma reference voltages in a single gamma reference voltage range (PGMA range) that can obtain luminance equal to or greater than the maximum luminance of the second pixel area UDC. The timing controller 130 may modulate the gamma characteristic of pixel data by using a digital gamma compensation technique using first and second look-up tables (LUT). The first lookup table includes data (or gamma compensation value) of the first gamma compensation curve that defines voltage-luminance in a range less than or equal to the maximum luminance of the first pixel area NML. The second lookup table includes data (or gamma compensation value) of the second gamma compensation curve that defines voltage-luminance in a range less than or equal to the maximum luminance of the second pixel area UDC. In FIG. 28, "NML GMA" is a luminance range defined by the first gamma compensation curve. "UDC GMA" is a luminance range defined by the second gamma compensation curve.

The timing controller 130 may input pixel data to be written to the pixels of the first pixel area NML into the first lookup table to modulate the pixel data to be written to the pixels of the first pixel area NML. The timing controller 130 may input pixel data to be written to the pixels disposed in the second emission region BB of the boundary pixel area BDR into the first lookup table to modulate the pixel data to be written to the pixels of the second emission region BB of the boundary pixel area BDR.

The timing controller 130 may input pixel data to be written to the pixels disposed in the emission region A of the second pixel area UDC into the second lookup table to modulate the pixel data to be written to the pixels of the emission region A of the second pixel area UDC. The timing controller 130 may input pixel data to be written to the pixels disposed in the first emission region BA of the boundary pixel area BDR into the second lookup table to modulate the pixel data to be written to the pixels of the first emission region BA of the boundary pixel area BDR. When the pixel data is inputted to the lookup tables, gamma compensation value data stored in an address indicated by the pixel data is outputted. Accordingly, the timing controller 130 may modulate the gamma characteristic of the pixel data by using the first and second lookup tables.

The objects to be achieved by the present disclosure, the means for achieving the objects, and advantages and effects of the present disclosure described above do not specify essential features of the claims, and thus, the scope of the claims is not limited to the disclosure of the present disclosure.

Although the embodiments of the present disclosure have been described in more detail with reference to the accompanying drawings, the present disclosure is not limited thereto and can be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure.

What is claimed is:

1. A display panel comprising:
a first pixel area, a second pixel area, and a boundary pixel area disposed between the first pixel area and the second pixel area,
wherein the boundary pixel area includes:
a plurality of first emission regions disposed on at least two row lines and at least two column lines; and
a plurality of second emission regions disposed on the at least two row lines and the at least two column lines,
wherein the plurality of first emission regions are spaced apart from each other in each column line and each row line,
wherein the plurality of second emission regions are connected to each other in a row direction and a column direction between the plurality of first emission regions, and
wherein each of the plurality of first emission regions and the plurality of second emission regions includes one or more pixels,
the second pixel area includes a plurality of emission regions,
at least one of the second emission regions from the plurality of second emission regions is disposed between a pair of first emission regions from said plurality of first emission regions without another one of said plurality of first emission regions between the pair of first emission regions,
a maximum luminance of a first emission region decreases as a distance from the second pixel area increases, and a maximum luminance of a second emission region from said plurality of emission regions increases as a distance from the second pixel area increases,
wherein the plurality of first emission regions and the plurality of second emission regions of the boundary pixel area, and the plurality of emission regions of the second pixel area are arranged into a plurality of lines of emission regions including a first line of emission regions and a second line of emission regions that is disposed directly after the first line of emission regions among said plurality of lines of emission regions, each of the plurality of lines of emission regions including a corresponding first emission region from the plurality of first emission regions at a first side of a boundary between the boundary pixel area and the second pixel area and a corresponding emission region from the plurality of emission regions at a second side of the boundary, and
wherein a first separation distance between outermost pixels that are closest to the boundary amongst all pixels in the corresponding first emission region of the boundary pixel area in the first line of emission regions and outermost pixels that are closest to the boundary amongst all pixels in the corresponding emission region of the second pixel area in the first line of emission regions is a same as a second separation distance between outermost pixels that are closest to the boundary amongst all pixels in the corresponding first emission region of the boundary pixel area in the second line of emission regions and outermost pixels that are closest to the boundary amongst all pixels in the corresponding emission region of the second pixel area in the second line of emission regions,
wherein the first separation distance and the second separation distance is greater than zero.

2. The display panel of claim 1, wherein the maximum luminance of the first emission region is lower than a maximum luminance of the second pixel area and higher than a maximum luminance of the first pixel area, and
the maximum luminance of the second emission region is lower than the maximum luminance of the second pixel area and lower than the maximum luminance of the first pixel area.

3. The display panel of claim 1, wherein light travels to an optical sensor disposed under the display panel through the second pixel area.

4. The display panel of claim 1, wherein a difference between the maximum luminance of the first emission region and the maximum luminance of the second emission region decreases as a distance from the second pixel area increases.

5. The display panel of claim 1, wherein a distance between said pair of first emission regions is equal to a distance between a pair of emission regions from said plurality of emission regions in the second pixel area without another one of said plurality of emission regions between the pair of emission regions.

6. The display panel of claim 5, wherein the separation distance between the corresponding emission region of the second pixel area and the corresponding first emission region of the boundary pixel area in each of the plurality of lines of emission regions is equal to the distance between the pair of emission regions in the second pixel area.

7. The display panel of claim 1, wherein each of the first and second emission regions includes a plurality of sub-pixels having different colors, and
in sub-pixels of a same color, a number of sub-pixels disposed in the second emission region is an integer multiple of a number of sub-pixels disposed in the first emission region.

8. The display panel of claim 7, wherein in sub-pixels of the same color, the number of sub-pixels disposed in the second emission region is greater than the number of sub-pixels disposed in the first emission region by the integer multiple of the number of sub-pixels disposed in the first emission region.

9. The display panel of claim 1, wherein a pixel density of the boundary pixel area is a same as that of the first pixel area and is higher than that of the second pixel area.

10. The display panel of claim 1, wherein a pixel density of a part of the boundary pixel area adjacent to the second pixel area is lower than a pixel density of the first pixel area, and is equal to or higher than a pixel density of the second pixel area.

11. The display panel of claim 1, wherein pixels of the first pixel area and pixels disposed in the second emission region of the boundary pixel area emit light with luminance defined by a first gamma compensation curve, pixels of the second pixel area and pixels disposed in the first emission region of the boundary pixel area emit light with luminance defined by a second gamma compensation curve, and a maximum luminance of the second gamma compensation curve is higher than a maximum luminance of the first gamma compensation curve.

\* \* \* \* \*